(12) United States Patent
Chen

(10) Patent No.: US 12,238,478 B2
(45) Date of Patent: Feb. 25, 2025

(54) TOP NOTCH SLIT PROFILE FOR MEMS DEVICE

(71) Applicant: Taiwan Semiconductor Manufacturing Company, Ltd., Hsinchu (TW)

(72) Inventor: Ting-Jung Chen, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 187 days.

(21) Appl. No.: 17/722,577

(22) Filed: Apr. 18, 2022

(65) Prior Publication Data

US 2023/0232159 A1    Jul. 20, 2023

Related U.S. Application Data

(60) Provisional application No. 63/300,346, filed on Jan. 18, 2022.

(51) Int. Cl.

| H04R 17/00 | (2006.01) |
|---|---|
| B81B 3/00 | (2006.01) |
| B81C 1/00 | (2006.01) |
| H04R 7/04 | (2006.01) |
| H04R 31/00 | (2006.01) |

(52) U.S. Cl.
CPC ........... *H04R 17/00* (2013.01); *B81B 3/0021* (2013.01); *B81C 1/00158* (2013.01); *H04R 7/04* (2013.01); *H04R 31/006* (2013.01); *B81B 2201/0257* (2013.01); *B81B 2203/0127* (2013.01); *B81B 2203/019* (2013.01); *B81B 2207/07* (2013.01); *B81C 2201/0132* (2013.01); *B81C 2201/056* (2013.01); *B81C 2203/0109* (2013.01); *H04R 2201/003* (2013.01)

(58) Field of Classification Search
CPC .. H04R 2201/003; H04R 7/04; H04R 31/006; B81B 2201/0257
See application file for complete search history.

(56) References Cited

U.S. PATENT DOCUMENTS

| 6,151,966 A | 11/2000 | Sakai et al. |
|---|---|---|
| 8,975,107 B2 | 3/2015 | Dehe et al. |

(Continued)

FOREIGN PATENT DOCUMENTS

CN    112441553 A    3/2021

*Primary Examiner* — Sunita Joshi
(74) *Attorney, Agent, or Firm* — Eschweiler & Potashnik, LLC

(57) ABSTRACT

Various embodiments of the present disclosure are directed towards a microelectromechanical systems (MEMS) device in which a slit at a movable mass of the MEMS device has a top notch slit profile. The MEMS device may, for example, be a speaker, an actuator, or the like. The slit extends through the movable mass, from top to bottom, and has a width that is uniform, or substantially uniform, from the bottom of the movable mass to proximate the top of movable mass. Further, in accordance with the top notch slit profile, top corner portions of the MEMS substrate in the slit are notched, such that a width of the slit bulges at the top of the movable mass. The top notch slit profile may, for example, increase the process window for removing an adhesive from the slit while forming the MEMS device.

20 Claims, 24 Drawing Sheets

(56) References Cited

U.S. PATENT DOCUMENTS

| | | |
|---|---|---|
| 2003/0209076 A1 | 11/2003 | Miao et al. |
| 2005/0218488 A1 | 10/2005 | Matsuo |
| 2009/0154734 A1 | 6/2009 | Jeong et al. |
| 2013/0168852 A1 | 7/2013 | Liang et al. |
| 2015/0158716 A1 | 6/2015 | Cheng et al. |
| 2016/0318758 A1* | 11/2016 | Chou .................... B81B 3/0021 |
| 2017/0006381 A1 | 1/2017 | Rusconi Clerici et al. |
| 2018/0321037 A1 | 11/2018 | Wen et al. |
| 2019/0127214 A1 | 5/2019 | Paci et al. |
| 2021/0061641 A1 | 3/2021 | Hu et al. |
| 2022/0024754 A1* | 1/2022 | Xia ....................... G01P 15/097 |

\* cited by examiner

TOP NOTCH SLIT PROFILE FOR MEMS DEVICE

REFERENCE TO RELATED APPLICATION

This Application claims the benefit of U.S. Provisional Application No. 63/300,346, filed on Jan. 18, 2022, the contents of which are incorporated by reference in their entirety.

BACKGROUND

Microelectromechanical systems (MEMS) devices are microscopic devices that integrate mechanical and electrical components to sense physical quantities and/or to act upon surrounding environments. In recent years, MEMS devices have become increasingly common. For example, MEMS speakers are commonly found in hearing aids, in-ear headphones, home speakers, television speakers, and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
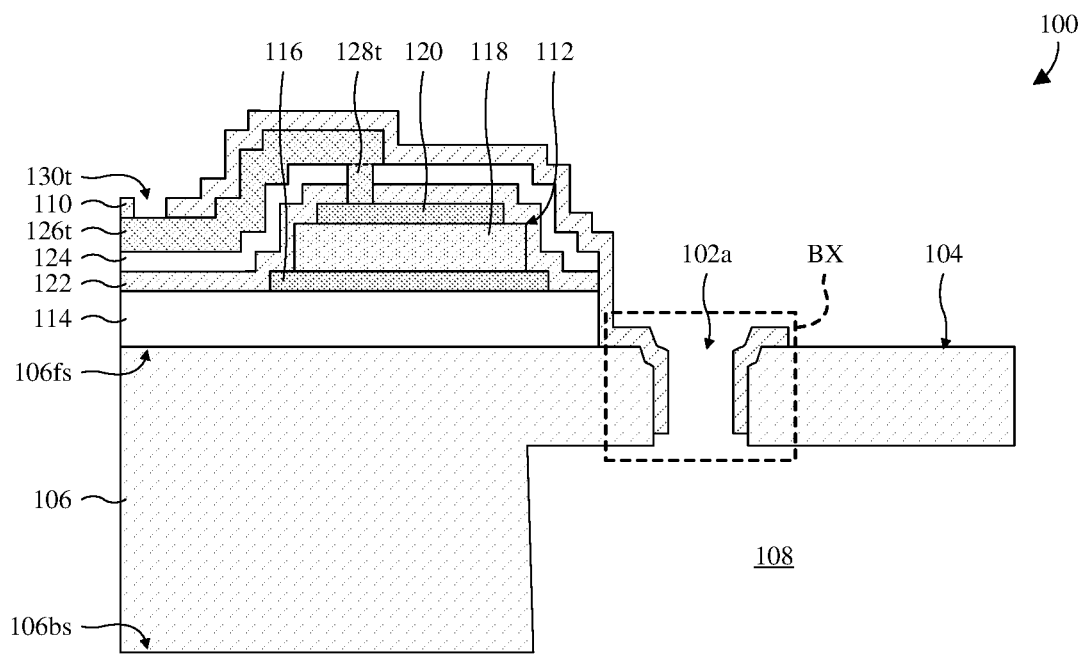
FIG. 1 illustrates a cross-sectional view of some embodiments of a microelectromechanical systems (MEMS) device in which a slit at a movable mass of the MEMS device has a top notch slit profile.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A microelectromechanical systems (MEMS) speaker may comprise a piezoelectric structure over a MEMS substrate, on a frontside of the MEMS substrate. The piezoelectric structure extends around a movable mass formed in the MEMS substrate and is configured to move the movable mass in response to application of an electric field to generate sound. To facilitate movement of the movable mass and generation of sound, a cavity extends into the MEMS substrate from a backside of the MEMS substrate, opposite the frontside of the MEMS substrate, to the movable mass. Further, a slit having a vertical profile extends through the MEMS substrate from the frontside of the substrate to the cavity at the movable mass.

In accordance with a method for forming the MEMS speaker, a carrier substrate is bonded to the frontside of the MEMS substrate with an adhesive layer, which fills the slit. An etch is then performed into the MEMS substrate from the backside of the MEMS substrate to form the cavity. After forming the cavity, the carrier substrate and the adhesive layer are removed to debond the carrier substrate from the MEMS substrate.

Challenges with the method may arise due to the adhesive layer and a width of the slit. In particular, the human ear is not sensitive to low frequency sound, whereby low frequency sound depends on a large displacement of air. Further, the slit leads to leakage of low frequency sound, thereby reducing the displacement of air. Accordingly, the smaller the width of the slit, the less low frequency sound leakage there is and the larger the displacement of air. However, the smaller the width of the slit, the more difficult it is to remove the adhesive layer from the slit. Failure to remove the adhesive layer from the slit may lead to failure of the MEMS speaker and may therefore reduce bulk manufacturing yields for the MEMS speaker. Indeed, if the width of the slit becomes too small, bulk manufacturing yields may reach zero.

Exacerbating the foregoing challenges, a passivation layer may be deposited lining the slit and may lead to bottlenecking and/or pinching off at a top of the slit. During deposition, material of the passivation layer may accumulate at a faster rate at top corners of the MEMS substrate that are in the slit than elsewhere in the slit. As such, the passivation layer may be thicker at the top corners than elsewhere in the slit and may reduce an effective width of the slit. This bottlenecking and/or pinching off is difficult to control and account for and it increases the difficulty of removing the adhesive layer from the slit.

Various embodiments of the present disclosure are directed towards a MEMS device in which a slit at a movable mass of the MEMS device has a top notch slit profile. The MEMS device may, for example, be a MEMS speaker, a MEMS actuator, or some other suitable type of MEMS device. The slit extends through the movable mass, from a top of the movable mass to a bottom of the movable mass, and has a width that is uniform, or substantially uniform, from the bottom of the movable mass to a point proximate the top of movable mass. Further, in accordance with the top notch slit profile, top corner portions of the MEMS substrate in the slit are notched, such that the width of the slit bulges at the top of the movable mass.

Because of the top notch slit profile, the slit is wider at the top of the movable mass than elsewhere. The increased width at the top of the movable mass increases the ease with which an adhesive layer may be removed from the slit during manufacture of the MEMS device. Therefore, a process window for removing the adhesive layer may be enlarged. Further, because of the increased width, top corners of the MEMS substrate that are in the slit are farther from a width-wise center of the slit than they would otherwise be if the slit had a vertical profile. Therefore, to the extent that a passivation layer is deposited lining the slit and deposits on the top corners at a faster rate than elsewhere in the slit, the increased width at the top of the slit may prevent the passivation layer from bottlenecking and/or pinching off the slit. This may further enlarge the process window for removing the adhesive layer.

Because of the enlarged process window, bulk manufacturing yields for the MEMS device may be increased. Further, the slit may be narrower than otherwise possible. In at least some embodiments in which the MEMS device is a speaker, the decreased width may decrease leakage of low frequency sound through the slit. This may, in turn, lead to a large displacement of air and increase audibility of low frequency sounds to the human ear.

With reference to FIG. 1, a cross-sectional view 100 of some embodiments of a MEMS device is provided in which a slit 102a at a movable mass 104 of the MEMS device has a top notch slit profile. The MEMS device is on a MEMS substrate 106 and may, for example, be or comprise a MEMS speaker or some other suitable type of MEMS device.

The movable mass 104 is formed in the MEMS substrate 106 and is on a frontside 106fs of the MEMS substrate 106. In at least some embodiments, the movable mass 104 may also be referred to as a movable membrane. Further, the movable mass 104 overlies a cavity 108 extending into the MEMS substrate 106 from a backside 106bs of the MEMS substrate 106, opposite the frontside 106fs of the MEMS substrate 106. The MEMS substrate 106 may, for example, be a bulk substrate of silicon or some other suitable type of semiconductor material. Alternatively, the MEMS substrate 106 may, for example, be a semiconductor-on-insulator (SOI) substrate or some other suitable type of semiconductor substrate. To the extent that the MEMS substrate 106 is an SOI substrate, the semiconductor material of the SOI substrate may, for example, be silicon or some other suitable type of semiconductor material.

The slit 102a is at the movable mass 104 and extends through the MEMS substrate 106, from a top surface of the movable mass 104 to a bottom surface of the movable mass 104, such that the slit 102a is in fluid communication with the cavity 108. Further, the slit 102a is conformally lined by a passivation layer 110 having a bottom surface elevated relative to that of the movable mass 104. In alternative embodiments, the bottom surfaces of the passivation layer 110 and the movable mass 104 are level. The passivation layer 110 may, for example, be or comprise silicon nitride and/or some other suitable dielectric material(s).

Figure 2:
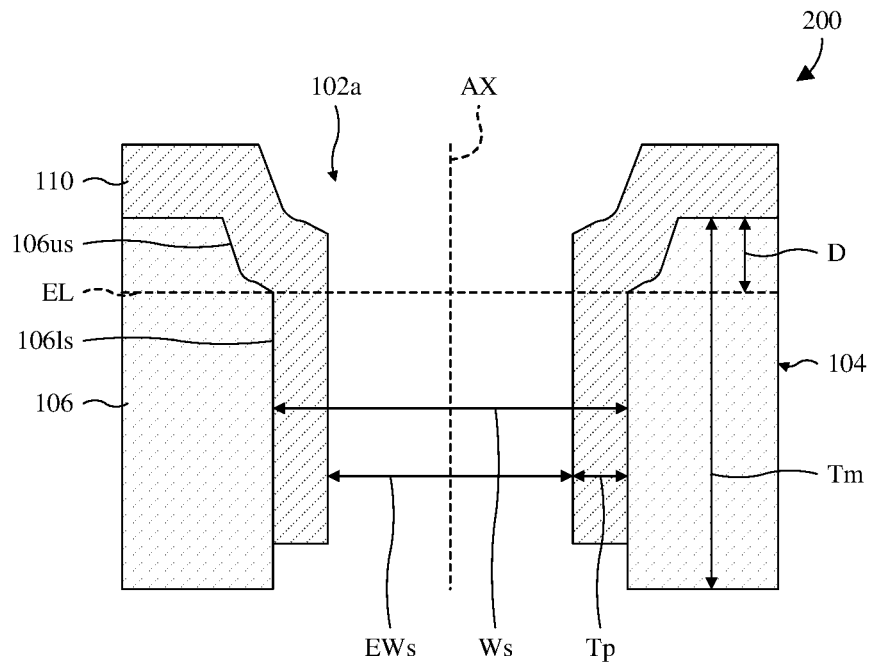
FIG. 2 illustrates an enlarged cross-sectional view of some embodiments of the slit of FIG. 1.

With reference to FIG. 2, an enlarged cross-sectional view 200 of some embodiments of the slit 102a of FIG. 1 is provided. The enlarged cross-sectional view 200 may, for example, be taken within box BX of FIG. 1. A width Ws of the slit 102a is uniform, or substantially uniform, from the bottom surface of the movable mass 104 to an elevation EL vertically between the bottom surface of the movable mass 104 and the top surface of the movable mass 104. Further, in accordance with the top notch slit profile of the slit 102a, top corner portions of the MEMS substrate 106 that are in the slit 102a are notched or indented. As such, the width Ws of the slit 102a bulges at the top surface of the movable mass 104. The slit 102a may, for example, have a Y shaped cross-sectional profile or some other suitable cross-sectional profile.

Because of the top notch slit profile, the slit 102a is wider at the top of the movable mass 104 than elsewhere in the slit 102a. The increased width increases the ease with which an adhesive layer may be removed from the slit 102a during manufacture of the MEMS device. Therefore, a process window for removing the adhesive layer may be enlarged. Further, because of the increased width, top corners of the MEMS substrate 106 that are in the slit 102a are farther from a width-wise center of the slit 102a than they would otherwise be if the slit 102a had a vertical profile. Therefore, to the extent that the passivation layer 110 deposits on the top corners at a faster rate than elsewhere in the slit 102a, the increased width at the top of the slit 102a may prevent the passivation layer 110 from bottlenecking and/or pinching off the slit 102a. This may further enlarge the process window for removing the adhesive layer.

Because of the enlarged process window, bulk manufacturing yields for the MEMS device may be increased. Further, the slit 102a may be narrower at a bottom of the movable mass 104 than otherwise possible. In at least some embodiments in which the MEMS device is a speaker, the decreased width may decrease leakage of low frequency sound through the slit 102a. This may, in turn, increase air displacement during use of the speaker and may hence increase audibility of low frequency sound to the human ear.

In some embodiments, the width Ws of the slit 102a increases continuously and/or discretely from the elevation EL to the top surface of the movable mass 104. Additionally, in some embodiments, the width Ws of the slit 102a is smallest at the bottom surface of the movable mass 104 and/or is smaller at the bottom surface of the movable mass 104 than at the top surface of the movable mass 104. The width Ws of the slit 102a has a maximum width value between the elevation EL and the bottom surface of the movable mass 104, and further has a width value (e.g., an average width value, a minimum width value, or the like) between the elevation EL and the top surface of the MEMS substrate 106. In some embodiments, a difference between the maximum width value and the width value is more than about 10%, 20%, 30%, 40%, or some other suitable percentage of the width value. In some embodiments, the difference between the maximum width value and the width value is about 10%-20%, about 20%-30%, about 30%-40%, or some other suitable percentage of the width value.

As noted above, the passivation layer 110 lines and partially fills the slit 102a, thereby partially filling the slit 102a. As such, the slit 102a has an effective width EWs that is less than the width Ws of the slit 102a. In some embodiments, the effective width EWs of the slit 102a is smallest at the bottom surface of the passivation layer 110 and/or is smaller at the bottom surface of the passivation layer 110 than at the top surface of the passivation layer 110. In some embodiments, the effective width EWs of the slit 102a has a minimum value that is about 0.5-5 micrometers, about 0.5-2.5 micrometers, about 2.5-5.0 micrometers, or some other suitable value. If the effective width EWs of the slit 102a has a minimum value that is too small (e.g., less than 0.5 micrometers), bulk manufacturing yields may be low due to, for example, difficulty removing an adhesive layer from the slit 102a. To the extent that the MEMS device is a speaker, and the effective width EWs of the slit 102a has a minimum value that is too large (e.g., greater than 5 micrometers), leakage of low frequency sound through the slit 102a may be high. As such, the speaker may have low sensitivity to low frequency sounds.

In some embodiments, a thickness Tp of the passivation layer 110 is about 0.05-0.5 micrometers, about 0.05-0.25 micrometers, about 0.25-0.5 micrometers, or some other suitable value. If the thickness Tp of the passivation layer 110 is too small (e.g., less than 0.05 micrometers), the effective width EWs of the slit 102a may have a minimum value that is too large as described above. To the extent that the MEMS device is a speaker, and the thickness Tp of the passivation layer 110 is too large (e.g., greater than 0.5 micrometers), the effective width EWs of the slit 102a may have a minimum value that is too small as described above. In some embodiments, the width Ws of the slit 102a is equal to two times the thickness Tp of the passivation layer 110 plus the effective width EWs of the slit 102a.

The MEMS substrate 106 has a pair of lower sidewalls 106ls and a pair of upper sidewalls 106us in the slit 102a. The lower sidewalls 106ls are respectively on opposite sides of the slit 102a, and the upper sidewalls 106us overlie and are arranged edge to edge respectively with the lower sidewalls 106ls. The lower sidewalls 106ls extend from the bottom surface of the movable mass 104 to the elevation EL, and the upper sidewalls 106us extend from the elevation EL to the top surface of the movable mass 104.

The lower sidewalls 106ls are vertical or substantially vertical. By substantially vertical, it is meant that the lower sidewalls 106ls are within about 5 degrees, 10 degrees, or some other suitable value of vertical. Vertical may, for example, correspond to perpendicular to the top surface of the movable mass 104 and/or perpendicular to a bottom surface of the MEMS substrate 106. The upper sidewalls 106us extend upward and outward respectively from the lower sidewalls 106ls to the top surface of the movable mass 104. Outward refers to away from a width-wise center of the slit 102a. The lower sidewalls 106ls may, for example, have a planar profile and/or some other suitable profile(s), and/or the upper sidewalls 106us may, for example, have curved profiles, arcing profiles, indented profiles, notched profiles, some other suitable profile(s), or any combination of the foregoing. In some embodiments, the slit 102a is symmetrical about a vertical axis AX at a width-wise center of the slit 102a.

In some embodiments, a thickness Tm of the movable mass 104 is about 2-20 micrometers, about 2-11 micrometers, about 11-20 micrometers, or some other suitable value. If the thickness Tm of the movable mass 104 is too small (e.g., less than 2 micrometers), the movable mass 104 may be prone to structural failure during use of the MEMS device. If the thickness Tm of the movable mass 104 is too large (e.g., more than 20 micrometers), the movable mass 104 may be overly rigid. For example, to the extent that MEMS device is a speaker, the speaker may have low sensitivity.

In some embodiments, the elevation EL is recessed relative to the top surface of the movable mass 104 by a distance D. In some embodiments, the distance D is about 0.05-0.5 micrometers, about 0.05-0.25 micrometers, about 0.25-0.5 micrometers, or some other suitable value. In some embodiments, a ratio of the thickness Tm of the movable mass 104 to the distance D is about 4:1 to 200:1, about 4:1 to 102:1, about 102:1 to 200:1, or some other suitable ratio. If the distance D is too small (e.g., less than 0.05 micrometers), or the ratio is too large (e.g., more than 200:1), the process window for removing an adhesive layer from the slit 102a may see little to know improvement from having the top notch slit profile. To the extent that the MEMS device is a speaker, and the distance D is too large (e.g., greater than 0.5 micrometers) or the ratio is too small (e.g., less than about 4:1), leakage of low frequency sound through the slit 102a may be high and the speaker may have low sensitivity to low frequency sound.

Referring back to FIG. 1, an actuator structure 112 overlies the MEMS substrate 106 and is separated from the MEMS substrate 106 by a substrate dielectric layer 114. The actuator structure 112 comprises a bottom electrode 116, a piezoelectric structure 118 overlying the bottom electrode 116, and a top electrode 120 overlying the piezoelectric structure 118. In at least some embodiments, the actuator structure 112 may also be referred to as a metal-piezoelectric-metal (MPM) structure. The bottom and top electrodes 116, 120 are configured to apply an electric field across the piezoelectric structure 118, and the piezoelectric structure 118 is configured to move in response to the electric field. Further, movement by the piezoelectric structure 118 is configured to move the movable mass 104 to, for example, generate sound.

An actuator barrier layer 122 overlies the actuator structure 112 and the substrate dielectric layer 114. The actuator barrier layer 122 is configured to block hydrogen ions and/or other suitable errant materials from diffusing to the piezoelectric structure 118 from over the actuator barrier layer 122. In some embodiments, the actuator barrier layer 122 may be regarded as a hydrogen-barrier layer. Hydrogen ions that diffuse to the piezoelectric structure 118 may accumulate in the piezoelectric structure 118 and induce delamination and breakdown of the piezoelectric structure 118, whereby the MEMS device may fail. Therefore, by blocking diffusion of hydrogen ions to the piezoelectric structure 118, the actuator barrier layer 122 may prevent failure of the MEMS device may fail.

An actuator dielectric layer 124 overlies the actuator barrier layer 122, a top electrode pad 126t overlies the actuator dielectric layer 124, and the passivation layer 110 overlies the top electrode pad 126t. A first end of the top electrode pad 126t overlies and is electrically coupled to the top electrode 120 by a top electrode via 128t extending from the top electrode pad 126t, through the actuator barrier layer 122 and the actuator dielectric layer 124, to the top electrode 120. A second end of the top electrode pad 126t is distal from the actuator structure 112 and is exposed by a top electrode pad opening 130t in the passivation layer 110.

In some embodiments, the actuator barrier layer 122 is a metal oxide or some other suitable material. The metal oxide may, for example, be or comprise aluminum oxide (e.g., $Al_2O_3$), titanium oxide (e.g., $TiO_2$), iron oxide (e.g., $Fe_2O_3$), zirconium oxide (e.g., $ZrO_2$), zinc oxide (e.g., ZnO), copper oxide (e.g., CuO), tantalum oxide (e.g., $Ta_2O_5$), some other suitable type of metal oxide, or any combination of the foregoing. In some embodiments, the actuator barrier layer 122 is dielectric and/or is crystalline.

In some embodiments, the substrate dielectric layer 114 is or comprises silicon oxide and/or some other suitable dielectric(s). In some embodiments, the actuator dielectric layer 124 is or comprises silicon oxide and/or some other suitable dielectric(s). In some embodiments, the substrate dielectric layer 114 and the actuator dielectric layer 124 are or comprise a same material. In other embodiments, the substrate dielectric layer 114 is a different material than the actuator dielectric layer 124. In some embodiments, the passivation layer 110 is or comprises silicon nitride and/or some other suitable dielectric(s).

In some embodiments, the piezoelectric structure 118 is or comprises lead zirconate titanate (e.g., PZT) and/or some other suitable piezoelectric material(s). In some embodiments, the bottom electrode 116 is or comprises titanium oxide, platinum, some other suitable metal(s) or conductive material(s), or any combination of the foregoing. In some embodiments, the top electrode 120 is or comprises titanium oxide, platinum, some other suitable metal(s) or conductive material(s), or any combination of the foregoing. In some embodiments, the bottom and top electrodes 116, 120 are or comprise a same material. In other embodiments, the bottom electrode 116 is a different material than the top electrode 120.

In some embodiments, the top electrode pad 126t is or comprises copper, aluminum copper, aluminum, some other suitable metal(s) or conductive material(s), or any combination of the foregoing. In some embodiments, the top electrode via 128t is or comprises copper, aluminum copper, aluminum, some other suitable metal(s) or conductive material(s), or any combination of the foregoing. In some embodiments, the top electrode pad 126t and the top electrode via 128t are the same material. In other embodiments, the top electrode pad 126t is a different material than the top electrode via 128t. In some embodiments, the actuator barrier layer 122 is configured to block material of the top electrode pad 126t from diffusing from the top electrode pad 126t to the piezoelectric structure 118. Such material may, for example, be or comprise copper and/or some other suitable material.

With reference to FIGS. 3A-3G, enlarged cross-sectional views 300A-300G of some alternative embodiments of the slit 102a of FIG. 1 are provided. The enlarged cross-sectional views 300A-300G may, for example, be taken within box BX of FIG. 1.

Figure 3A:
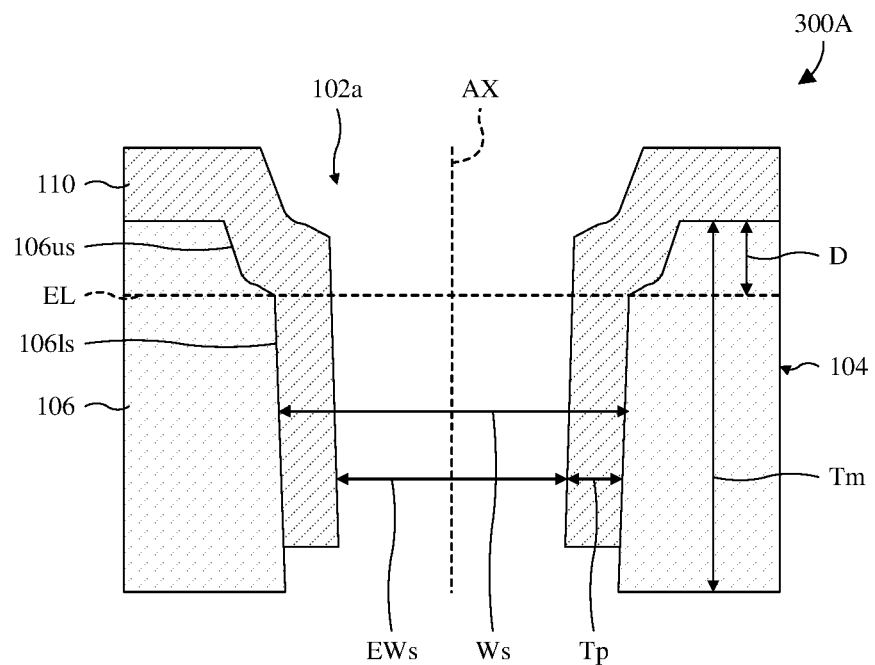
FIGS. 3A-3G illustrate cross-sectional views of some alternative embodiments of the slit of FIG. 1.

In FIG. 3A, the lower sidewalls 106ls of the MEMS substrate 106 are slanted inward from the elevation EL to the bottom surface of the movable mass 104. Inward refers to towards a width-wise center of the slit 102a.

Figure 3B:
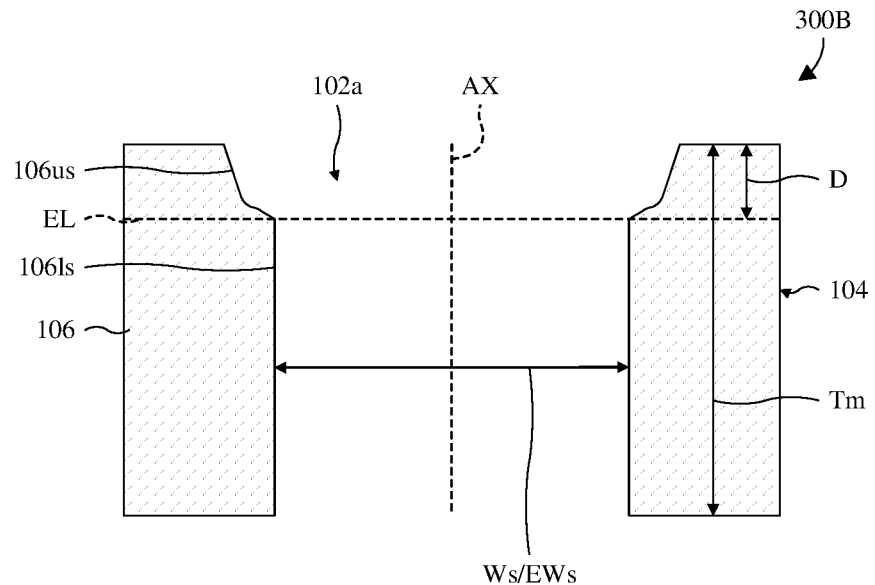

In FIG. 3B, the passivation layer 110 is omitted from the slit 102a. Accordingly, the width Ws of the slit 102a and the effective width EWs of the slit 102a are the same.

Figure 3C:
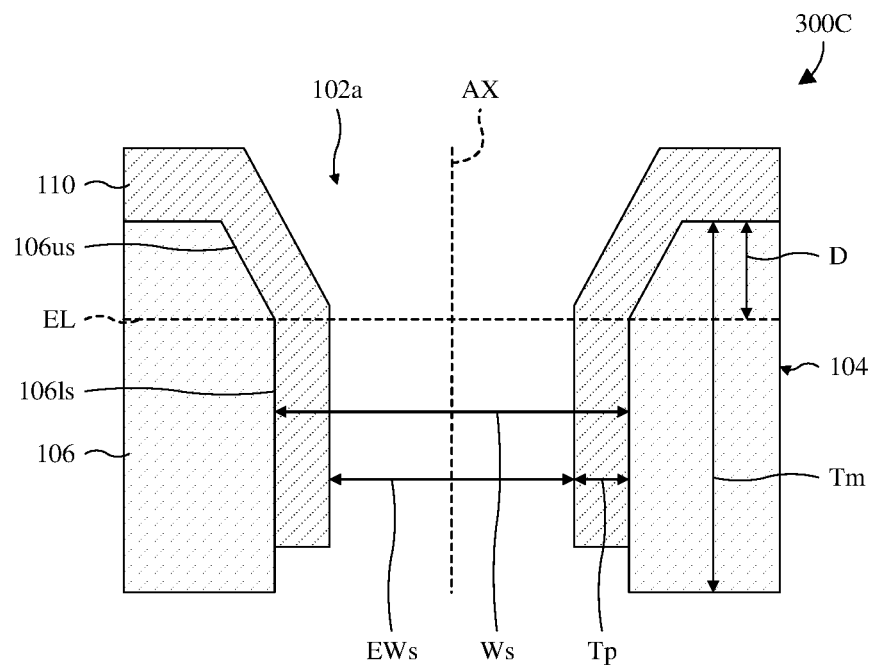

In FIG. 3C, the upper sidewalls 106us of the MEMS substrate 106 have planar or substantially planar profiles. As such, the width Ws of the slit 102a increases continuously, and linearly or substantially linearly, respectively from the lower sidewalls 106ls of the MEMS substrate 106 to the top surface of the MEMS substrate 106.

Figure 3D:
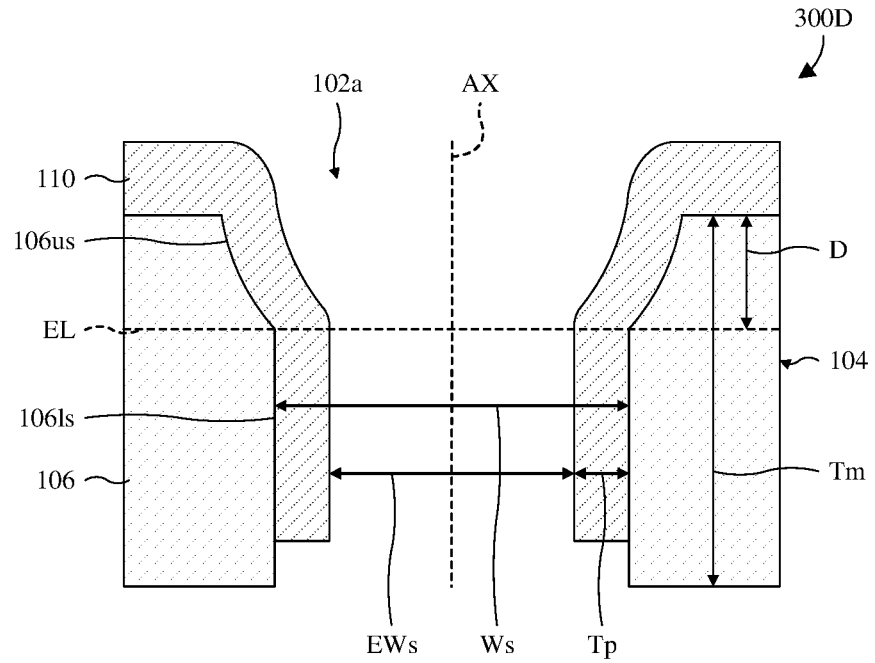

In FIG. 3D, the upper sidewalls 106us of the MEMS substrate 106 have curved profiles arcing respectively from the lower sidewalls 106ls of the MEMS substrate 106 to the top surface of the MEMS substrate 106. As such, the width Ws of the slit 102a increases continuously and nonlinearly respectively from the lower sidewalls 106ls of the MEMS substrate 106 to the top surface of the MEMS substrate 106.

Figure 3E:
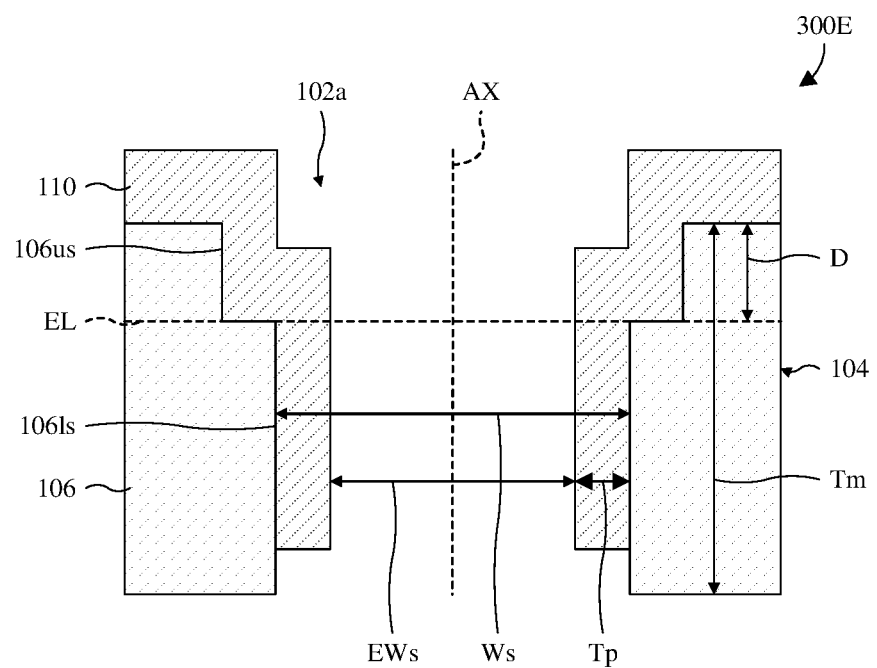

In FIG. 3E, the lower sidewalls 106ls of the MEMS substrate 106 are laterally between and offset from the upper sidewalls 106us of the MEMS substrate 106. Further, the width Ws of the slit 102a discretely increases from the lower sidewalls 106ls to the upper sidewalls 106us at the elevation EL. The elevation EL may, for example, correspond to top edges of the lower sidewalls 106ls and/or bottom edges of the upper sidewalls 106us. Accordingly, opposite sides of the slit 102a each has a stepped profile.

Figure 3F:
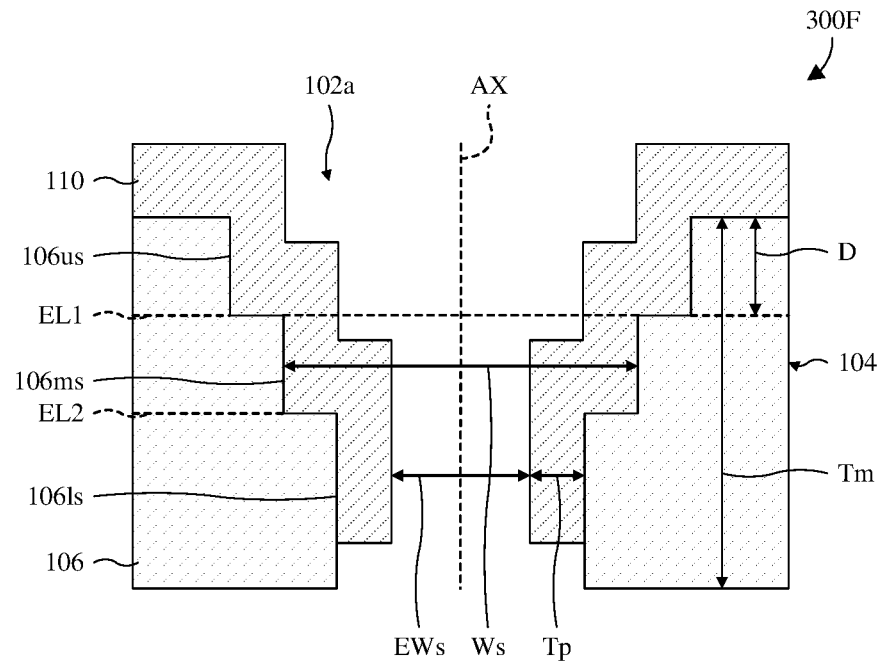

In FIG. 3F, opposite sides of the slit 102a each has a stepped profile as in FIG. 3E. However, in contrast with FIG. 3E, each stepped profile has an additional step. Accordingly, the MEMS substrate 106 further has a pair of middle sidewalls 106ms in the slit 102a, respectively on the opposite sides of the slit 102. The upper sidewalls 106us of the MEMS substrate 106 extend from the top surface of the MEMS substrate 106 to a first elevation EL1 between the top surface of the MEMS substrate 106 and the bottom surface of the movable mass 104. The middle sidewalls 106ms of the MEMS substrate 106 are laterally between and offset from the upper sidewalls 106us. Further, the middle sidewalls 106ms extend from the first elevation EL1 to a second elevation EL2 between the first elevation EL1 and the bottom surface of the movable mass 104. The lower sidewalls 106ls of the MEMS substrate 106 are laterally between and offset from the middle sidewalls 106ms. Further, the lower sidewalls 106ls extend from the second elevation EL2 to the bottom surface of the movable mass 104.

Because of the additional steps in the stepped profiles of the slit 102a, the width Ws of the slit 102 discretely decreases from the upper sidewalls 106us of the MEMS substrate 106 to the middle sidewalls 106ms of the MEMS substrate 106 at the first elevation EL1. The first elevation EL1 may, for example, correspond to top edges of the middle sidewalls 106ms and/or bottom edges of the upper sidewalls 106us. Additionally, the width Ws of the slit 102 discretely decreases from the middle sidewalls 106ms of the MEMS substrate 106 to the lower sidewalls 106ls of the MEMS substrate 106 at the second elevation EL2. The second elevation EL2 may, for example, correspond to top edges of the lower sidewalls 106ls and/or bottom edges of the middle sidewalls 106ms.

Figure 3G:
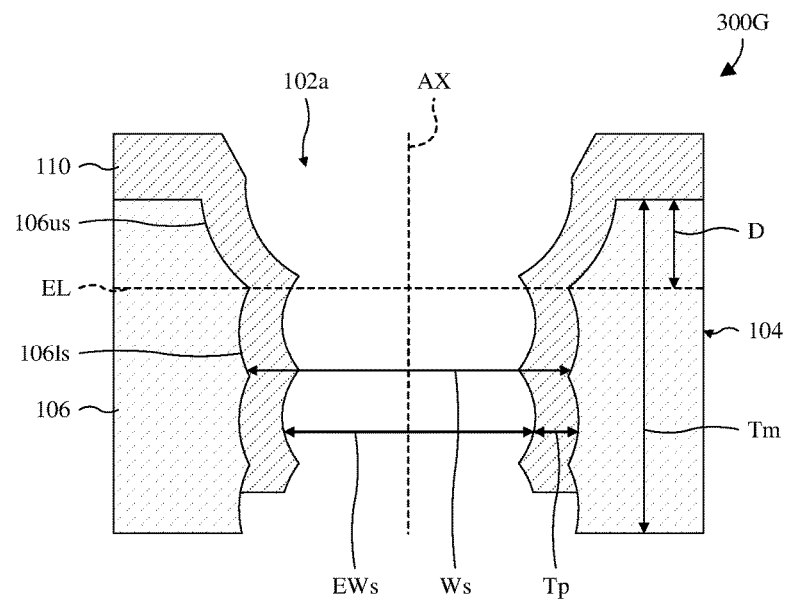

In FIG. 3G, the lower sidewalls 106ls of the MEMS substrate 106 have scalloped profiles and the upper sidewalls 106us of the MEMS substrate 106 have curved profiles arcing respectively from the lower sidewalls 106ls to the top surface of the of the MEMS substrate 106. The scalloped profiles of the lower sidewalls 106ls may, for example, result from formation of the slit 102a using a Bosch etch or the like.

Figure 4:
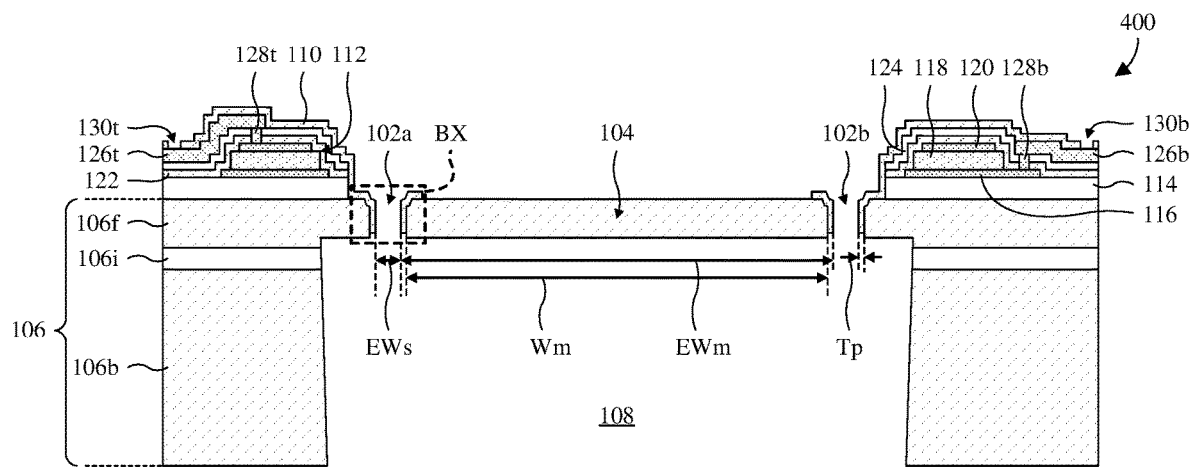
FIG. 4 illustrates an expanded cross-sectional view of some embodiments of the MEMS device of FIG. 1 in which an actuator structure of the MEMS device surrounds the movable mass.

With reference to FIG. 4, an expanded cross-sectional view 400 of some embodiments of the MEMS device of FIG. 1 is provided in which the actuator structure 112 surrounds the movable mass 104. As such, the actuator structure 112 has individual segments respectively on opposite sides of the movable mass 104.

The top electrode pad 126t and a bottom electrode pad 126b are respectively on opposite sides of the movable mass 104. A first end of the top electrode pad 126t overlies and is electrically coupled to the top electrode 120 by a top electrode via 128t extending from the top electrode pad 126t to the top electrode 120. A second end of the top electrode pad 126t is distal from the first end of the top electrode pad 126t and is exposed by a top electrode pad opening 130t in the passivation layer 110. In some embodiments, the top electrode pad 126t and the top electrode via 128t are formed by a common layer. A first end of the bottom electrode pad 126b overlies and is electrically coupled to the bottom electrode 116 by a bottom electrode via 128b extending from the bottom electrode pad 126b to the bottom electrode 116. A second end of the bottom electrode pad 126b is distal from the first end of the bottom electrode pad 126b and is exposed by a bottom electrode pad opening 130b in the passivation layer 110. In some embodiments, the bottom electrode pad 126b and the bottom electrode via 128b are formed by a common layer.

The actuator structure 112 overlies the MEMS substrate 106, which is a semiconductor-on-insulator (SOI) substrate comprising a backside semiconductor layer 106b, an insulator layer 106i overlying the backside semiconductor layer 106b, and an frontside semiconductor layer 106f overlying the insulator layer 106i. In alternative embodiments, the MEMS substrate 106 is a bulk silicon substrate or some other suitable type of bulk substrate. The backside semiconductor layer 106b and the frontside semiconductor layer 106f are or comprise silicon and/or some other suitable semiconductor material(s). The insulator layer 106i is or comprises silicon oxide and/or some other suitable dielectric material(s).

The movable mass 104 is formed in the frontside semiconductor layer 106f and has an effective width EWm. The effective width EWm is a width Wm of the movable mass 104 plus two times the thickness Tp of the passivation layer 110 since the passivation layer 110 lines sidewalls of the movable mass 104. In some embodiments, the effective width EWm of the movable mass 104 is about 500-5000 micrometers, about 500-2750 micrometers, about 2750-5000 micrometers, or some other suitable value. Further, in some embodiments, the width Wm of the movable mass 104 is about 500-5000 micrometers, about 500-2750 micrometers, about 2750-5000 micrometers, or some other suitable value.

The slit 102 and an additional slit 102b are arranged at the movable mass 104 and extend through the frontside semiconductor layer 106f, from a top surface of the frontside semiconductor layer 106f to the cavity 108. Further, the slit 102a and the additional slit 102b are respectively on opposite sides of the movable mass 104 and are lined by the passivation layer 110. The slit 102a and the additional slit 102b may, for example, also be known as a first slit 102a and a second slit 102b or vice versa. The additional slit 102b is as the slit 102a is illustrated and described with regard to FIGS. 1 and 2, whereby the additional slit 102b and the slit 102a share the same cross-sectional profile. In alternative embodiments, the additional slit 102b and the slit 102a have different cross-sectional profiles.

While FIGS. 3A-3G describe numerous variations to the slit 102a of FIG. 1, these variations may also be applied to the slit 102a of FIG. 4 and/or to the additional slit 102b of FIG. 4. For example, the slit 102a of FIG. 4 and/or the additional slit 102b of FIG. 4 may alternatively have a cross-sectional profile as in any of FIGS. 3A and 3C-3G.

As described with regard to FIG. 2, the slit 102a has an effective width EWs. In some embodiments, a ratio of the effective width EWm of the movable mass 104 to the effective width EWs of the slit 102a is about 3:1 to 1.02:1, about 3:1 to 2.01:1, about 2.01:1 to 1.02:1, or some other suitable ratio. If the ratio is too small (e.g., less than 1.02:1), and the MEMS device is a speaker, the speaker may have low sensitivity and/or audibility. If the ratio is too large (e.g., more than 3:1, the slit 102a may be too small as described above and/or the movable mass 104 may be structurally weak and prone to failure (e.g., from collapse).

The cavity 108 extends through the backside semiconductor layer 106b and the insulator layer 106i, and further extends into a bottom of the frontside semiconductor layer 106f. Further, the backside semiconductor layer 106b, the insulator layer 106i, and the frontside semiconductor layer 106f form a pair of common sidewalls. The common sidewalls are respectively on opposite sides of the cavity 108 and are slanted.

Figure 5:
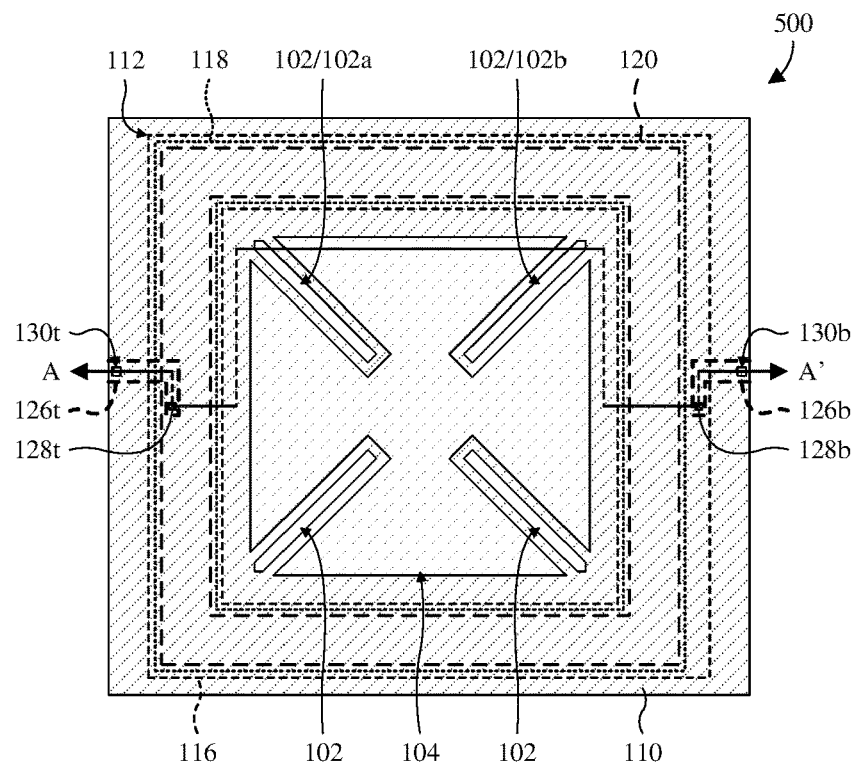
FIG. 5 illustrates a top layout view of some embodiments of the MEMS device of FIG. 4.

With reference to FIG. 5, a top layout view 500 of some embodiments of the MEMS device of FIG. 4 is provided. The cross-sectional view 400 of FIG. 4 may, for example, be taken along line A-A', and the portions of the MEMS device illustrated in the cross-sectional view 400 of FIG. 4 may, for example, correspond to solid portions of line A-A' as opposed to dashed portions of line A-A'.

The movable mass 104 has a square top geometry, and a plurality of slits 102 extend through the movable mass 104. In alternative embodiments, the movable mass 104 has a circular top geometry or some other suitable top geometry. The slits 102 extend respectively from the four corners of the movable mass 104 towards a center of the movable mass 104 and are each as the slit 102a of FIGS. 1 and 2 is illustrated and described. As such, the slits 102 share the same cross-sectional profile. In alternative embodiments, the slits 102 have different cross-sectional profiles. Further, the slits 102 are evenly spaced circumferentially around a center of the movable mass 104. In other embodiments, the slits 102 may be unevenly spaced circumferentially around the center of the movable mass 104. Further, in other embodiments, more or less slits 102 extend through movable mass 104.

The actuator structure 112 (constituents of which are shown in phantom) has a square ring-shaped top geometry that extends in a closed path around the movable mass 104. In alternative embodiments, the actuator structure 112 has some other suitable top geometry. Further, the top electrode pad 126t and the bottom electrode pad 126b (both shown in phantom) extend respectively from the top electrode via 128t and the bottom electrode via 128b respectively to locations laterally offset from the actuator structure 112.

Figure 6:
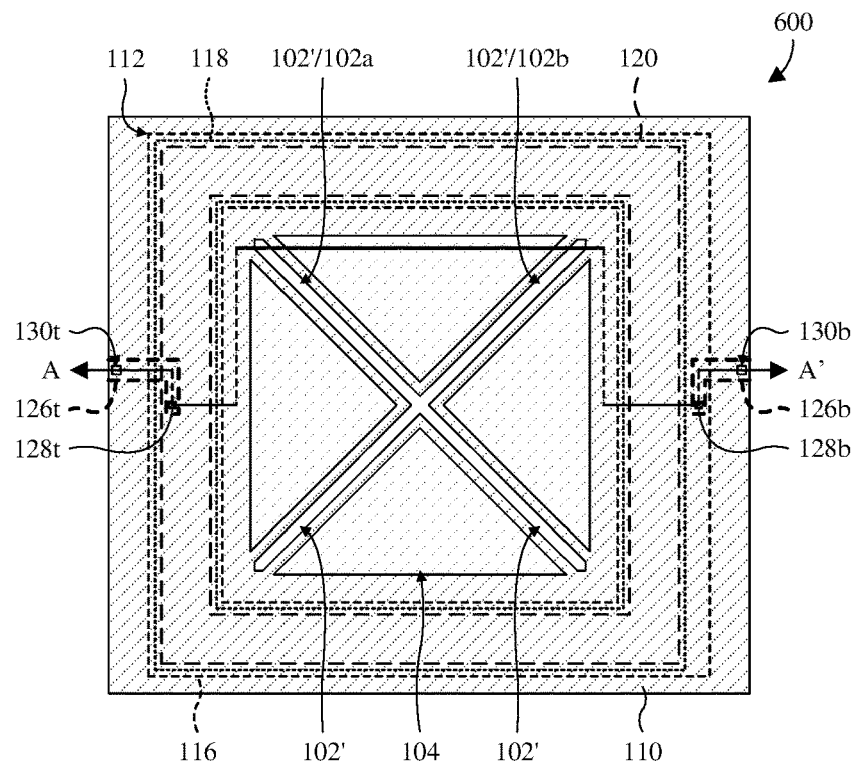
FIG. 6 illustrates a top layout view of some alternative embodiments of the MEMS device of FIG. 4.

With reference to FIG. 6, a top layout view 600 of some alternative embodiments of the MEMS device of FIG. 5 is provided in which a single slit 102' extends through the movable mass 104 and has a cross-shaped top geometry. As such, the slit 102a of FIG. 4 and the additional slit 102b of FIG. 4 correspond to segments of the single slit 102'. In alternative embodiments, the single slit 102' may have some other suitable top geometry.

With reference to FIGS. 7A-7D, cross-sectional views 700A-700D of some alternative embodiments of the MEMS device of FIG. 4 are provided.

Figure 7A:
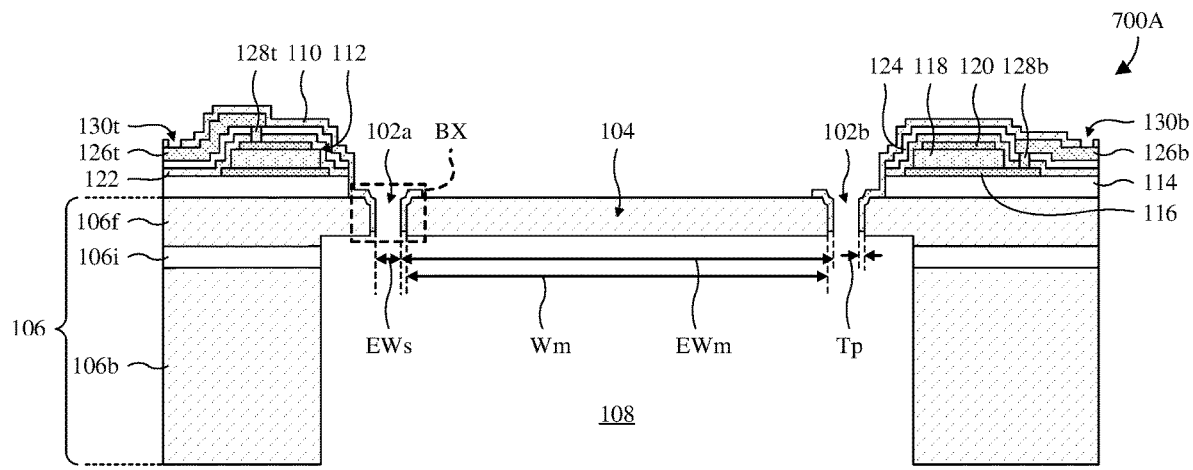
FIGS. 7A-7D illustrate cross-sectional views 700A-700D of some alternative embodiments of the MEMS device of FIG. 4.

In FIG. 7A, individual sidewalls of the MEMS substrate 106 in the cavity 108 are vertical. As such, the sidewalls extend perpendicular to a top surface of the MEMS substrate 106 and/or a top surface of the actuator structure 112.

Figure 7B:
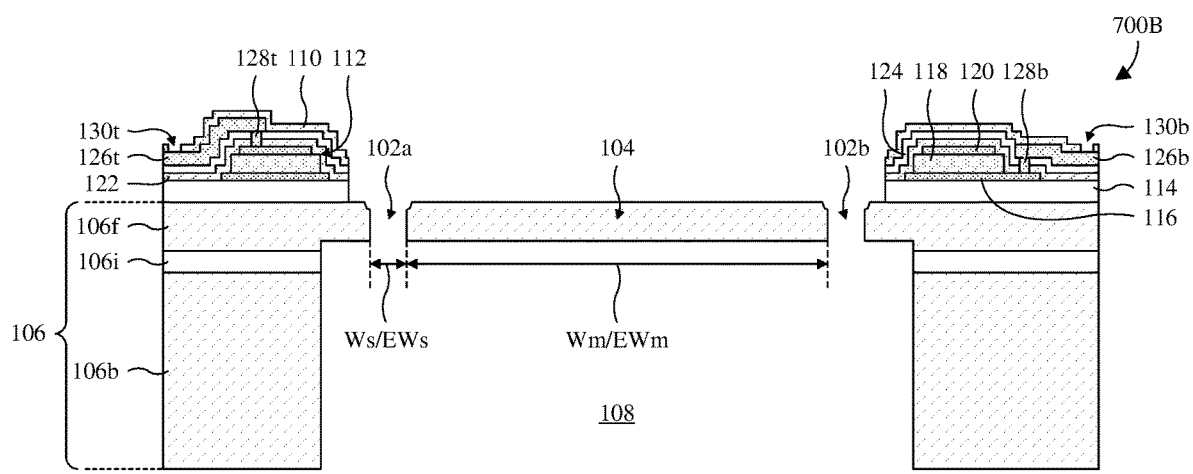

In FIG. 7B, the passivation layer 110 is omitted from the slit 102a and the additional slit 102b, whereby the effective width EWm of the movable mass 104 and the width Wm of the movable mass 104 are the same. Further, the passivation layer 110, the substrate dielectric layer 114, the actuator barrier layer 122, and the actuator dielectric layer 124 form a pair of common sidewalls facing each other and surrounded by the actuator structure 112. Further, the commons sidewalls are respectively on opposite sides of the movable mass 104.

Figure 7C:
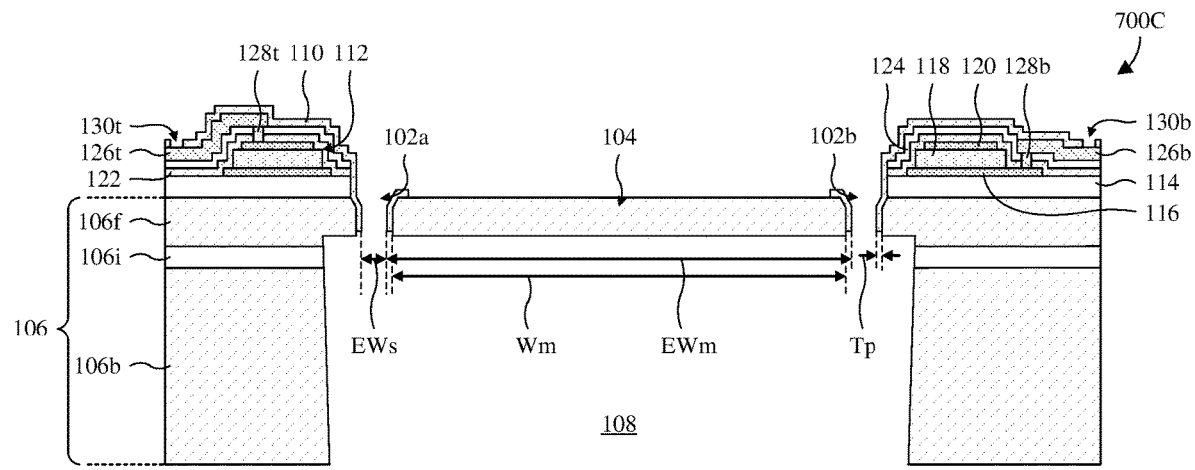

In FIG. 7C, the slit 102a and the additional slit 102b are respectively at opposing sidewalls of the substrate dielectric layer 114. Further, the slit 102a and the additional slit 102b each have the cross-sectional profile of the slit 102a in FIG. 3C.

Figure 7D:
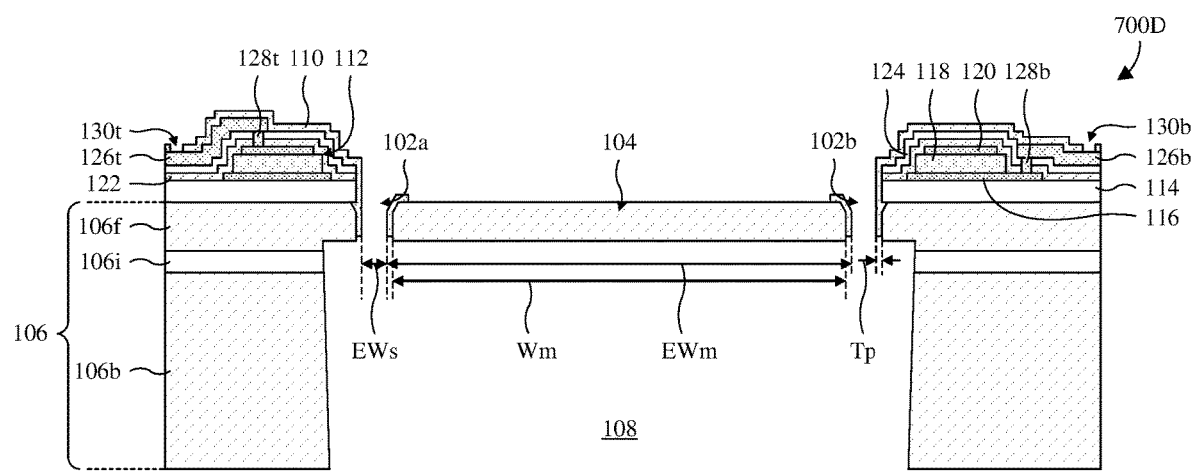

In FIG. 7D, the slit 102a and the additional slit 102b partially underlie the substrate dielectric layer 114. Further, the slit 102a and the additional slit 102b each have the cross-sectional profile of the slit 102a in FIG. 3C.

Figure 8:
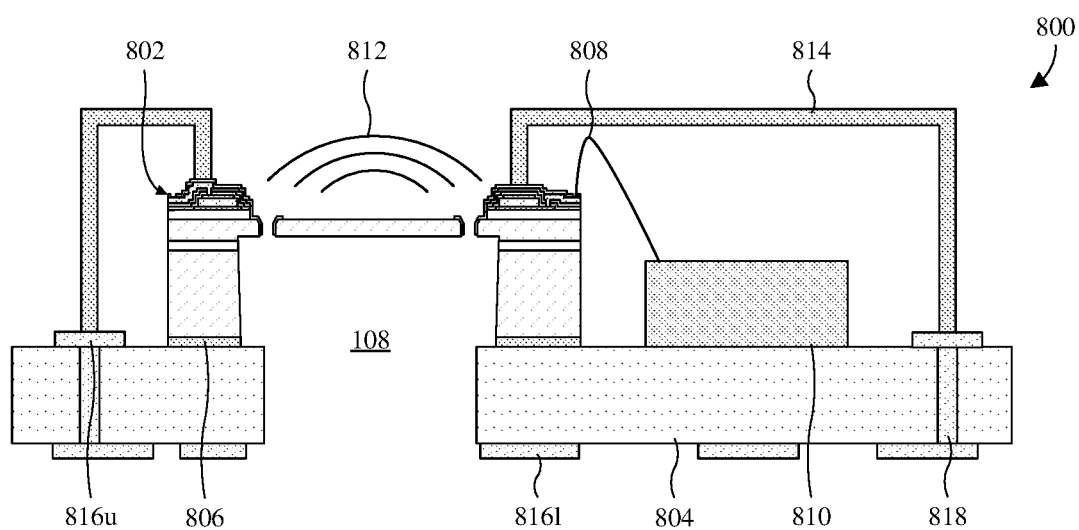
FIG. 8 illustrates a cross-sectional view of some embodiments of a MEMS package in which the MEMS device of FIG. 4 is packaged on a printed circuit board (PCB).

With reference to FIG. 8, a cross-sectional view 800 of some embodiments of a MEMS package is provided in which a MEMS device 802 as in FIG. 4 overlies and is adhered to a printed circuit board (PCB) 804. The MEMS device 802 is adhered to the PCB 804 by an adhesive layer 806 between the PCB 804 and the MEMS device 802, and the cavity 108 of the MEMS device 802 extends through the PCB 804 and the adhesive layer 806.

A wire bond 808 extends from the bottom electrode pad 126b of the MEMS device 802 (see, e.g., FIG. 4) to an integrated circuit (IC) chip 810 overlying and mounted to the PCB 804 adjacent to the MEMS device 802. Further, while not shown, an additional wire bond may extend from the top electrode pad 126t of the MEMS device 802 (see, e.g., FIG. 4) to the IC chip 810 and/or the PCB 804. To the extent that the MEMS device 802 is a speaker, the IC chip 810 may, for example, be configured to control the MEMS device 802 to generate sound 812.

A cap structure 814 fully covers the IC chip 810 and partially covers the MEMS device 802. As to the latter, the cap structure 814 partially covers the MEMS device 802 at a periphery of the MEMS device 802 without covering the movable mass 104 of the MEMS device 802 (see, e.g., FIG. 4). Further, the cap structure 814 is mounted to the PCB 804 through upper PCB pads 816u. The upper PCB pads 816u are arranged atop the PCB 804, on an opposite side of the PCB 804 as lower PCB pads 816l, and PCB vias 818 extend respectively from the upper PCB pads 816u respectively to some of the lower PCB pads 816l.

Figure 9:
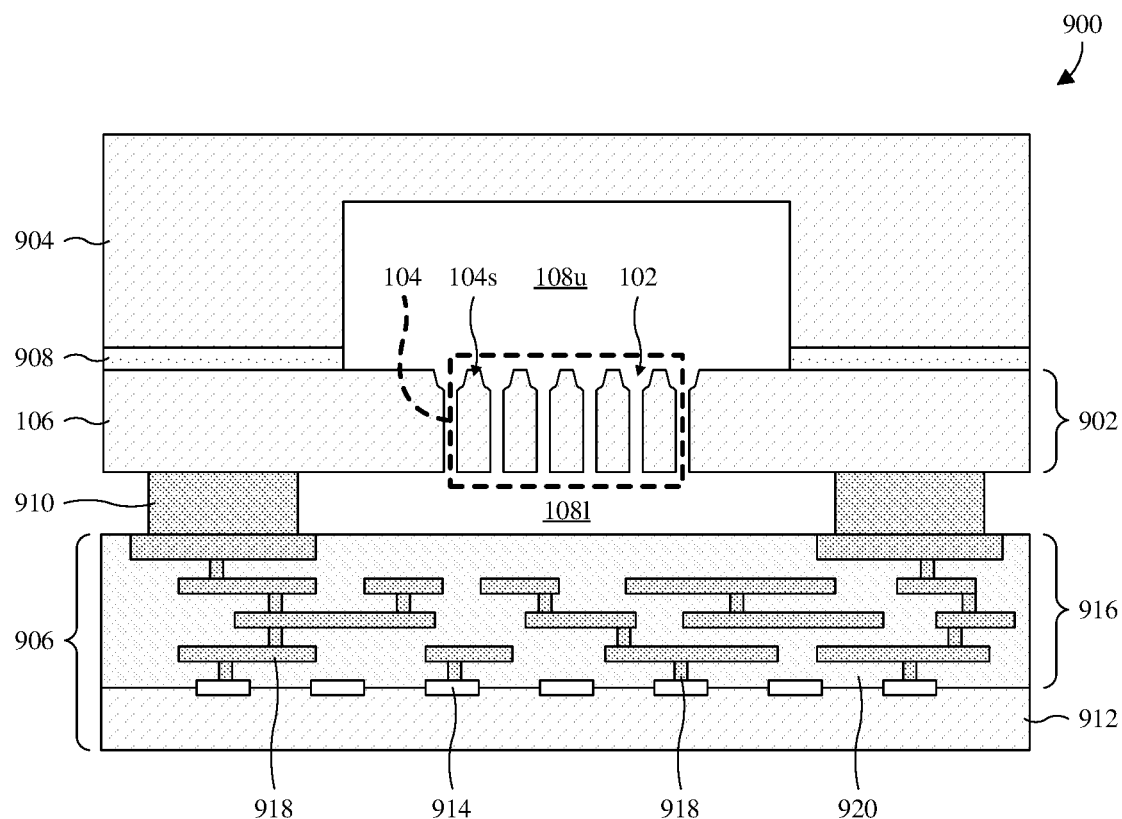
FIG. 9 illustrates a cross-sectional view of some alternative embodiments of a MEMS package in which a slit at a movable mass of a MEMS device has a top notch slit profile.

With reference to FIG. 9, a cross-sectional view 900 of some embodiments of a MEMS package is provided in which a plurality of slits 102 at a movable mass 104 of a MEMS device 902 each have a top notch slit profile. The MEMS device 902 may, for example, be or comprise a MEMS actuator or some other suitable type of MEMS device.

The movable mass 104 is formed in the MEMS substrate 106 and has a plurality of segments 104s separated from each other by the slits 102. The segments 104s may, for example, have finger-shaped top geometries or some other suitable top geometries. Further, the movable mass 104 is configured to move within a lower cavity 108l and an upper cavity 108u. The upper cavity 108u overlies the MEMS substrate 106 and extends into a bottom of a cap substrate 904 that overlies and is bonded to the MEMS substrate 106. The lower cavity 108l underlies the MEMS substrate 106, between the MEMS substrate 106 and an IC chip 906 that underlies and is bonded to the MEMS substrate 106. The MEMS substrate 106 may, for example, be a bulk substrate of silicon or some other suitable type of semiconductor material, a semiconductor-on-insulator (SOI) substrate, or some other suitable type of substrate.

The slits 102 are at the movable mass 104 and each extends through the MEMS substrate 106, from a top surface of the movable mass 104 to a bottom surface of the movable mass 104. As such, the slits 102 interconnect the lower cavity 108l and the upper cavity 108u. Further, the slits 102 demarcate the segments 104s of the movable mass 104 and are each as the slit 102a of FIGS. 1 and 2 is illustrated and described, except that there is no passivation layer 110 in the slits 102. In alternative embodiments, each of one, some, or all of the slits 102 may be as the slit 102a in any of FIGS. 3A-3G is illustrated and described.

Figure 10:
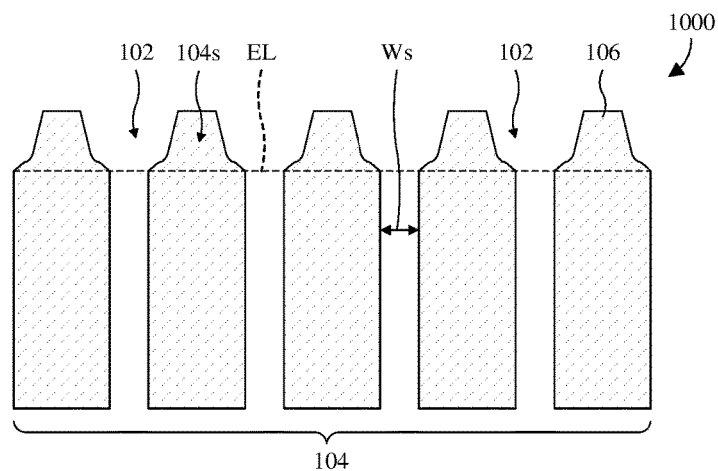
FIG. 10 illustrates an enlarged cross-sectional view of some embodiments of the slit of FIG. 9.

With reference to FIG. 10, an enlarged cross-sectional view 1000 of some embodiments of the slits 102 of FIG. 9 is provided. The slits 102 have individual widths Ws that are uniform, or substantially uniform, from the bottom surface of the movable mass 104 to an elevation EL, which is vertically between the bottom surface of the movable mass 104 and the top surface of the movable mass 104. Further, in accordance with the top notch slit profile of the slits 102, top corner portions of the MEMS substrate 106 that are in the slits 102 are notched or indented. As such, the individual widths Ws of the slits 102 bulge at the top surface of the movable mass 104. Further, each segment 104s of the slits 102 has an upward protrusion at the top surface of the movable mass 104. The slits 102 may, for example, have a Y shaped cross-sectional profile or some other suitable cross-sectional profile.

Because of the top notch slit profile, the slits 102 are wider at the top of the movable mass 104 than elsewhere in the slits 102. The increased widths at the top of the movable mass 104 increase the ease with which an adhesive layer may be removed from the slits 102 during manufacture of the MEMS device 902. Therefore, a process window for removing the adhesive layer may be enlarged and bulk manufacturing yields may be increased. Further, because of the increased widths of the slits 102, the MEMS device 902 is more resilient during operation. In particular, the increased widths reduce the likelihood of damage to the movable mass 104 upon collision between the segments 104s of the movable mass 104. Further, the increased widths reduce top surface area of the movable mass 104, which reduces the likelihood of stiction between the cap substrate 904 (see, e.g., FIG. 9) and the movable mass 104.

Referring back to FIG. 9, the cap substrate 904 overlies and is bonded to the MEMS substrate 106 through an adhesive layer 908. Further, the IC chip 906 underlies and is bonded to the MEMS substrate 106 through contacts 910. The contacts 910 are conductive and form conductive paths from the IC chip 906 to the MEMS device 902, whereby the IC chip 906 may be configured to control the MEMS device 902.

The IC chip 906 comprises a semiconductor substrate 912, a plurality of semiconductor devices 914, and an interconnect structure 916. The semiconductor devices 914 overlie and are at least partially formed in the semiconductor substrate 912. The semiconductor devices 914 may, for example, be or comprise metal-oxide-semiconductor field-effect transistors (MOSFETs), fin field-effect transistors (fin-FETs), gate-all-around field-effect transistors (GAA FETs), some other suitable semiconductor devices, or any combination of the foregoing. The interconnect structure 916 overlies and is electrically coupled to the semiconductor devices 914. Further, the interconnect structure 916 comprises a plurality of conductive features 918 stacked in an interconnect dielectric layer 920 to form a plurality of conductive paths interconnecting the semiconductor devices 914 and/or extending from the semiconductor devices 914 to the contacts 910. The conductive features 918 may, for example, be or comprise wires, vias, pads, the like, or any combination of the foregoing.

While FIG. 10 is described with regard to the MEMS device 902 of FIG. 9, it is to be appreciated that the structure of FIG. 10 is not limited to MEMS devices and finds application outside of MEMS devices. In particular, the top notch profile of the slits 102 in FIG. 10 may find application for packaging processes that comprise: 1) bonding the MEMS substrate 106 (more generally referred to as a substrate outside the context of MEMS devices) to a carrier substrate using an adhesive, which fills the slits 102; and 2) subsequently debonding the carrier substrate and removing the adhesive from the slits 102.

With reference to FIGS. 11, 12A, 12B, 13, 14A, 14B, 15, 16A, 16B, and 17-23, a series of cross-sectional views of some embodiments of a method for forming a MEMS device in which a slit at a movable mass of the MEMS device has a top notch slit profile. Figures labeled with a suffix of "A" or with no suffix correspond to cross-sectional views, and figures labeled with a suffix of "B" correspond to top layout views for like numbered figured with a suffix of "A". The cross-sectional views of figures labeled with a suffix "A" may, for example, be taken along solid portions of line A-A' in the top layout views of corresponding figures labeled with a suffix of "B". The method may, for example, be employed to form the MEMS device of FIG. 4 or some other suitable MEMS device. Further, the MEMS device of the method may, for example, be a speaker or some other suitable MEMS device.

Figure 11:
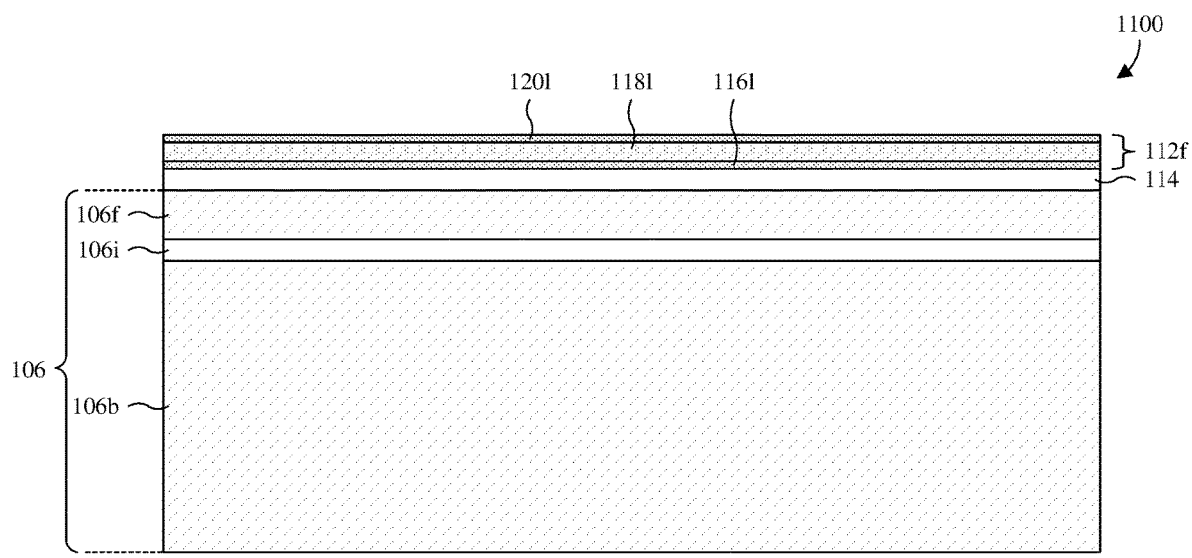
FIGS. 11, 12A, 12B, 13, 14A, 14B, 15, 16A, 16B, and 17-23 illustrate a series of cross-sectional views of some embodiments of a method for forming a MEMS device in which a slit at a movable mass of the MEMS device has a top notch slit profile.

As illustrated by a cross-sectional view 1100 of FIG. 11, a substrate dielectric layer 114 is deposited over a MEMS substrate 106. The MEMS substrate 106 is an SOI substrate and comprises a backside semiconductor layer 106b, an insulator layer 106i overlying the backside semiconductor layer 106b, and a frontside semiconductor layer 106f overlying the insulator layer 106i. In alternative embodiments, the MEMS substrate 106 is a bulk semiconductor substrate or some other suitable type of semiconductor substrate.

Also illustrated by the cross-sectional view 1100 of FIG. 11, an actuator film 112f is deposited over the substrate dielectric layer 114 and comprises a bottom electrode layer 116l, a piezoelectric layer 118l overlying the bottom electrode layer 116l, and a top electrode layer 120l overlying the piezoelectric layer 118l. The actuator film 112f may, for example, be deposited by physical vapor deposition (PVD), atomic layer deposition (ALD), some other suitable deposition process(es), or any combination of the foregoing.

Figure 12A:
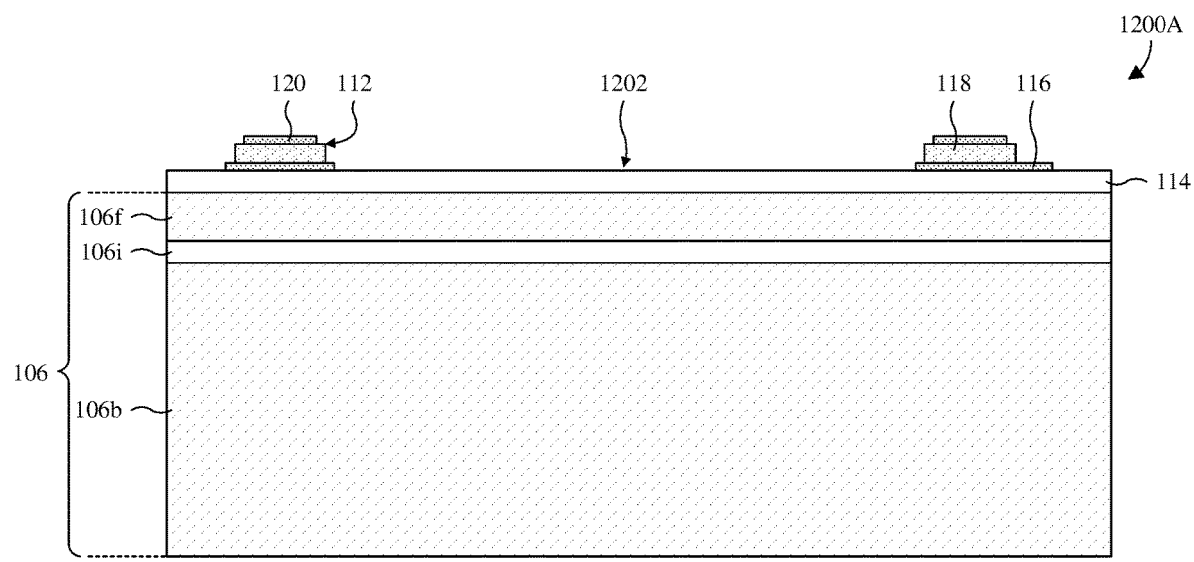
Figure 12B:
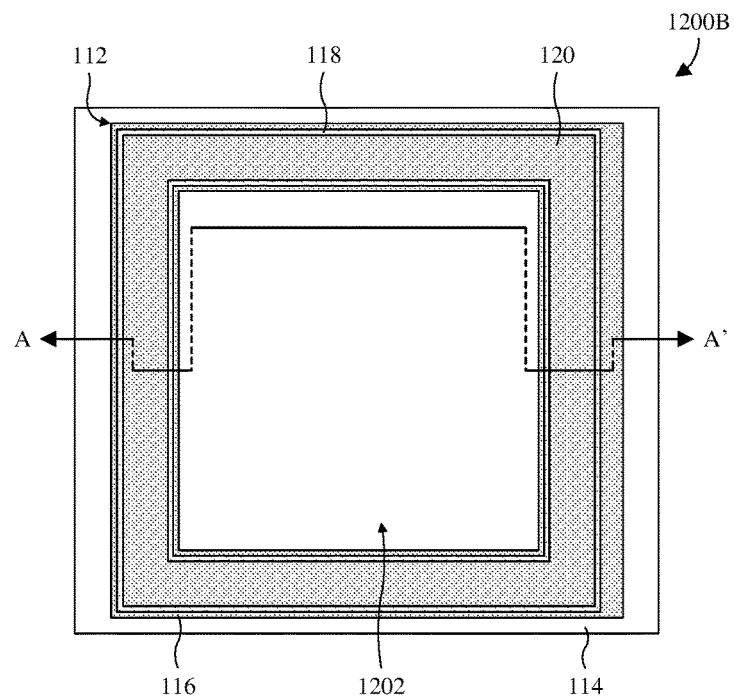

As illustrated by a cross-sectional view 1200A of FIG. 12A, and a top layout view 1200B of FIG. 12B, the actuator film 112f (see, e.g., FIG. 11) is patterned to form an actuator structure 112 having a ring-shaped top geometry and extending in a closed path around a central area 1202. In alternative embodiments, the actuator structure 112 may have some other suitable top geometry extending in a closed path around the central area 1202. The actuator structure 112 comprises a bottom electrode 116, a piezoelectric structure 118 overlying the bottom electrode 116, and a top electrode 120 overlying the piezoelectric structure 118.

In some embodiments, a process for performing the patterning comprises: 1) performing a first photolithography/etching process into the top electrode layer 120l using a first mask to form the top electrode 120; 2) performing a second photolithography/etching process into the piezoelectric layer 118l using a second mask to form the piezoelectric structure 118; and 3) performing a third photolithography/etching process into the bottom electrode layer 116l using a third mask to form the bottom electrode 116. In alternative embodiments, some other suitable process is performed for the patterning.

Figure 13:
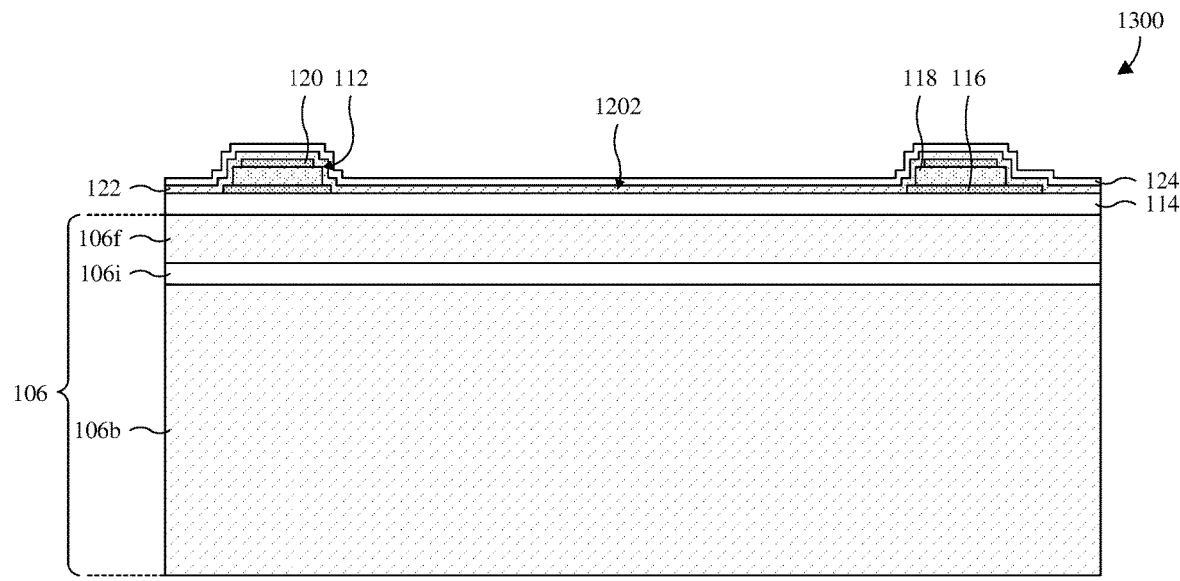

As illustrated by a cross-sectional view 1300 of FIG. 13, an actuator barrier layer 122 is deposited covering the actuator structure 112 and the substrate dielectric layer 114. The actuator barrier layer 122 is configured to block hydrogen and/or other suitable errant materials from diffusing to the piezoelectric structure 118 from over the actuator barrier layer 122. By blocking diffusion of errant materials (e.g., hydrogen ions) to the piezoelectric structure 118, the actuator barrier layer 122 may prevent failure of the MEMS device being formed.

In some embodiments, the actuator barrier layer 122 is dielectric. In some embodiments, the actuator barrier layer 122 is a metal oxide or some other suitable material. The metal oxide may, for example, be or comprise aluminum oxide (e.g., $Al_2O_3$), titanium oxide (e.g., $TiO_2$), iron oxide (e.g., $Fe_2O_3$), zirconium oxide (e.g., $ZrO_2$), zinc oxide (e.g., ZnO), copper oxide (e.g., CuO), tantalum oxide (e.g., $Ta_2O_5$), some other suitable type of metal oxide, or any combination of the foregoing. In some embodiments, actuator barrier layer 122 is deposited by a process that does not expose the piezoelectric structure 118 to hydrogen ions and/or other suitable errant materials. For example, the piezoelectric structure 118 may be deposited by PVD, ALD, or some other suitable deposition process(es).

Also illustrated by the cross-sectional view 1300 of FIG. 13, an actuator dielectric layer 124 is deposited covering the actuator barrier layer 122. The actuator dielectric layer 124 may, for example, be or comprise tetraethyl orthosilicate (TEOS) oxide and/or some other suitable dielectric(s). In some embodiments, the actuator dielectric layer 124 is deposited by a deposition process that exposes the actuator barrier layer 122 to hydrogen ions and/or other errant materials. In such embodiments, the actuator barrier layer 122 blocks the errant material (e.g., the hydrogen ions) from accumulating in the piezoelectric structure 118.

Figure 14A:
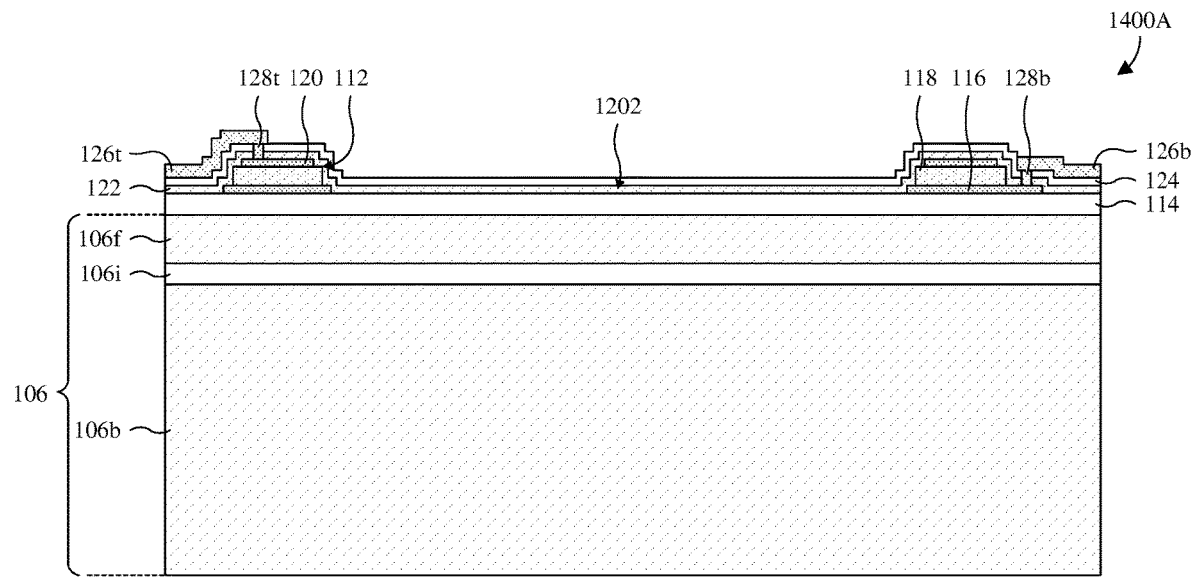
Figure 14B:
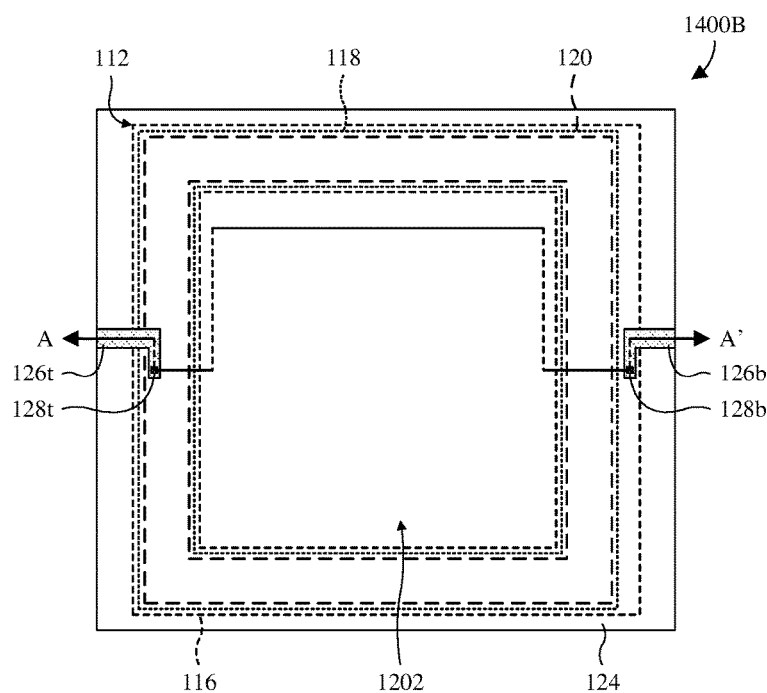

As illustrated by a cross-sectional view 1400A of FIG. 14A, and a top layout view 1400B of FIG. 14B, a plurality of pads and a plurality of vias are formed. A top electrode pad 126t and a bottom electrode pad 126b overlie the actuator structure 112 and are respectively on opposite sides of the actuator structure 112. The top electrode pad 126t overlies the top electrode 120, and a top electrode via 128t extends from the top electrode pad 126t to the top electrode 120. The bottom electrode pad 126b overlies the bottom electrode 116, and a bottom electrode via 128b extends from the bottom electrode pad 126b to the bottom electrode 116.

In some embodiments, a process for forming the pads and the vias comprises: 1) patterning the actuator dielectric layer 124 and the actuator barrier layer 122 to form a pair of via openings respectively exposing the top electrode 120 and the bottom electrode 116; 2) depositing a conductive layer covering the actuator dielectric layer 124 and filling the via openings to form the bottom electrode via 128b and the top electrode via 128t in the via openings; and 3) performing a photolithography/etching process to pattern the conductive layer into the bottom electrode pad 126b and the top electrode pad 126t. In alternative embodiments, some other suitable process is performed for forming the pads and the vias.

Figure 15:
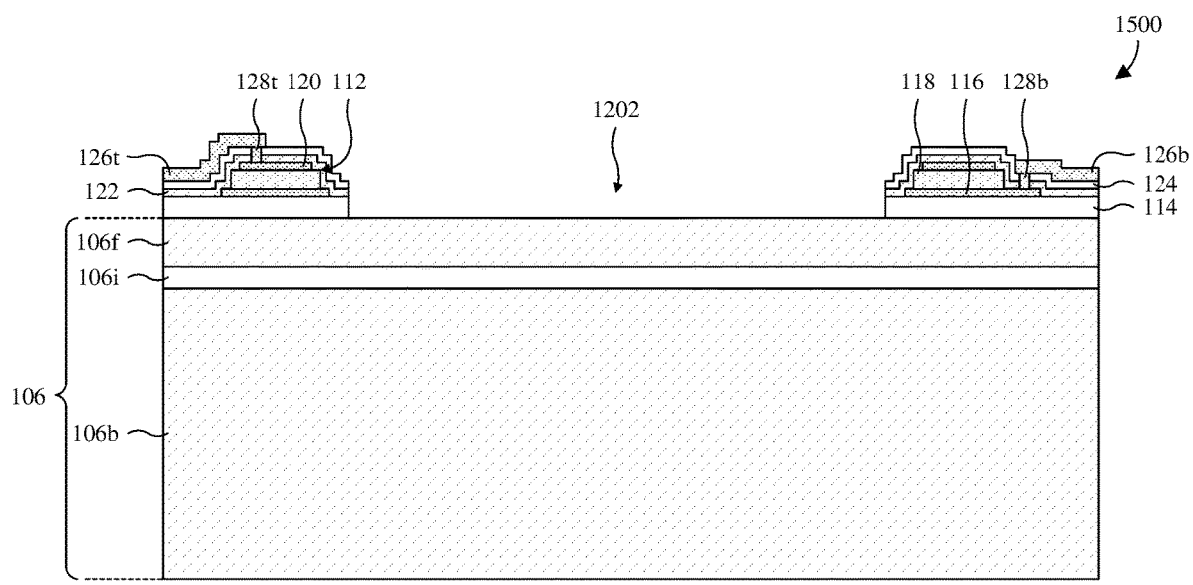

As illustrated by a cross-sectional view 1500 of FIG. 15, the actuator dielectric layer 124, the actuator barrier layer 122, and the substrate dielectric layer 114 are patterned to expose the MEMS substrate 106 at the central area 1202 surrounded by the actuator structure 112. The patterning may, for example, be performed by a photolithography/etching process or some other suitable patterning process.

Figure 16A:
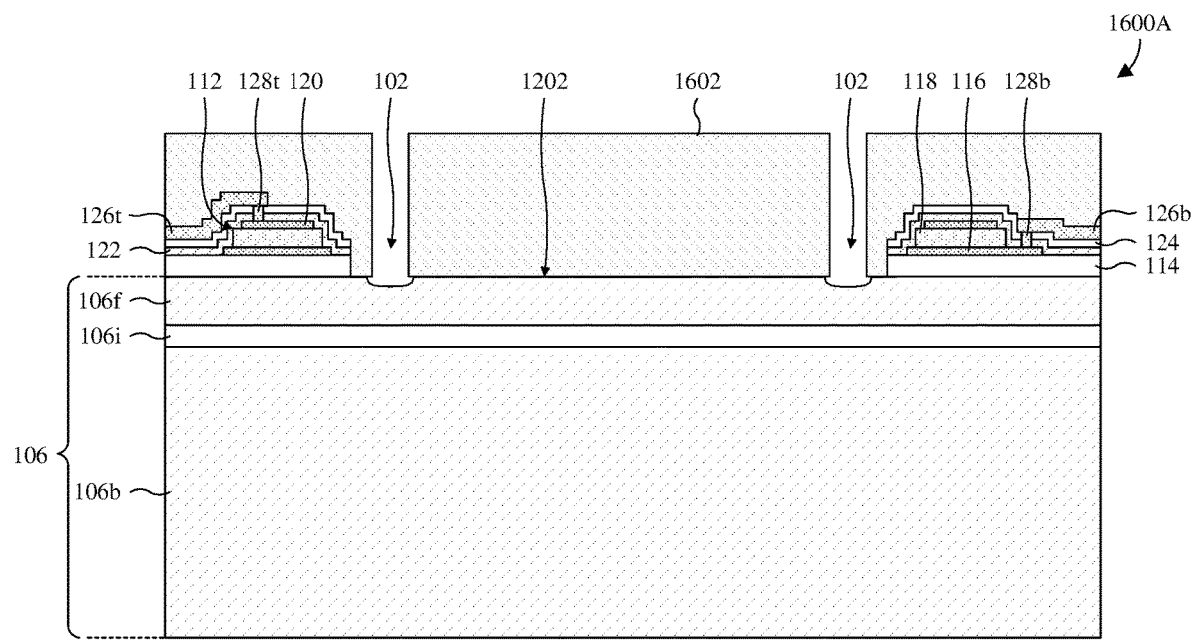
Figure 16B:
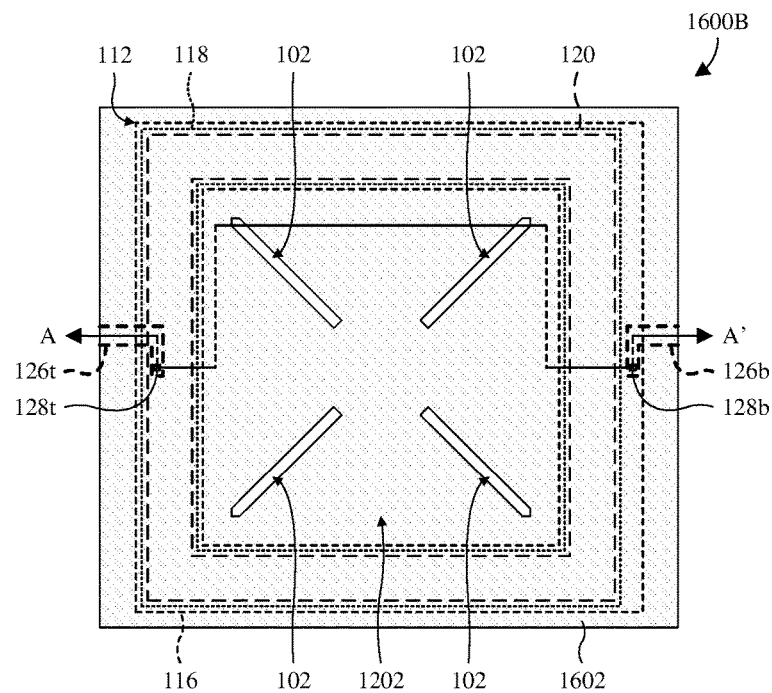

As illustrated by a cross-sectional view 1600A of FIG. 16A, and a top layout view 1600B of FIG. 16B, a mask 1602 is formed overlying the structure of FIG. 15 and a first etch is performed into the MEMS substrate 106 with the mask 1602 in place. The first etch notches a top surface of the MEMS substrate 106 to partially form a plurality of slits 102 at the central area 1202 surrounded by the actuator structure 112. Put another way, the first etch forms a plurality of notches extending into the top surface of the MEMS substrate 106, and the plurality of notches respectively and partially form the plurality of slits 102. The partially formed slits 102 each individually have an isotropic top notch profile and undercut the mask 1602. In alternative embodiments, the slits 102 each individually have some other suitable profile. Additionally, as better seen in FIG. 16B, the slits 102 extend from corners of the central area 1202 towards a center of the central area 1202. In alternative embodiments, the slits 102 directly contact at the center of the central area 1202 to form a common slit having a cross-shaped top geometry. FIG. 6 provides a non-limiting example of these alternative embodiments.

In some embodiments, the mask 1602 is photoresist and formed by photolithography. In alternative embodiments, the mask 1602 is a hard mask formed by depositing a hard mask layer and subsequently patterning the hard mask layer by a photolithography/etching process or some other suitable patterning process. In yet other alternative embodiments, the mask 1602 is some other suitable type mask and/or is formed by some other suitable process. In some embodiments, the first etch is performed by an isotropic etch process. For example, the first etch may be performed by a sulfur hexafluoride (e.g., $SF_6$) plasma etch or some other suitable type of plasma etch, a wet etch, or some other suitable type of etch.

Figure 17:
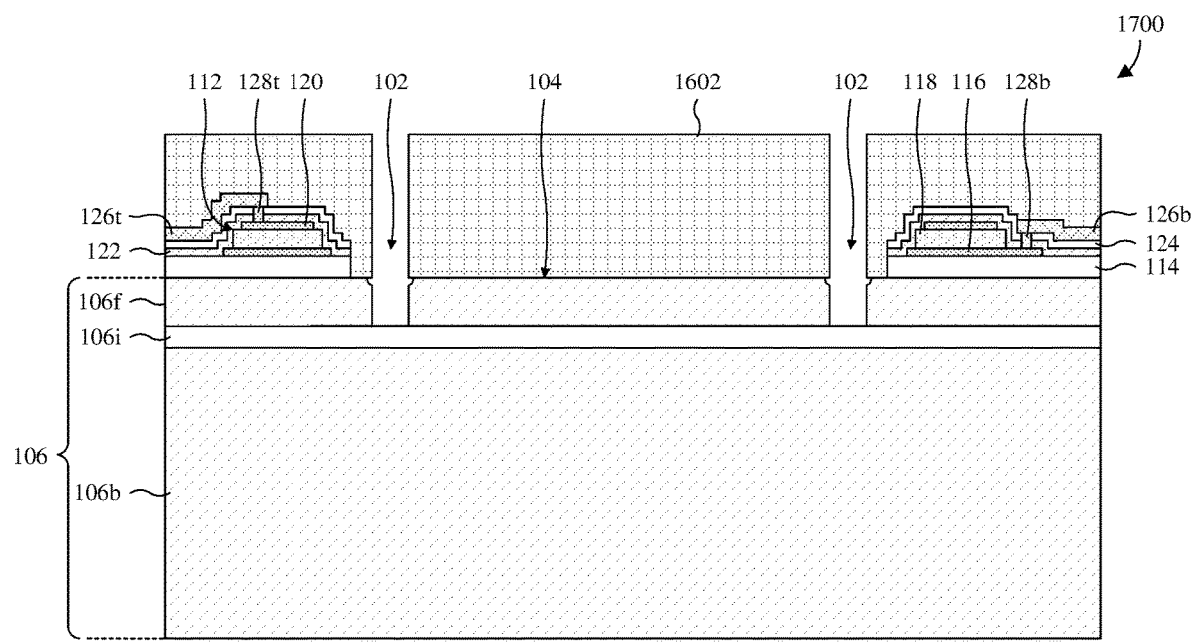

As illustrated by a cross-sectional view 1700 of FIG. 17, a second etch is performed into the MEMS substrate 106 with the mask 1602 of FIGS. 16A and 16B in place to extend the slits 102 to the insulator layer 106i of the MEMS substrate 106. Put another way, the second etch forms a plurality of trenches overlapping with the notches formed by the first etch, and the plurality of notches and the plurality of trenches collectively form the plurality of slits 102. In contrast with the first etch, the trench portions of the slits 102 formed by the second etch have a lesser width than the notch portions formed by the first etch. Further, the trench portions extend into the MEMS substrate 106 to a greater depth than the notch portions. In at least some embodiments, this results from the first etch being isotropic and the second etch being anisotropic.

In some embodiments, the second etch is performed by a plasma etch that etches the MEMS substrate 106 with plasma formed from sulfur hexafluoride (e.g., $SF_6$), chlorine (e.g., $Cl_2$), carbon tetrafluoride (e.g., $CF_4$), fluroform (e.g., $CHF_3$), difluoromethane (e.g., $CH_2F_2$), hydrogen bromide (e.g., HBr), some other suitable type of compound, or any combination of the foregoing. In at least some of the foregoing embodiments, the frontside semiconductor layer 106f of the MEMS substrate 106, which is etched by the second etch, is or comprises silicon and/or some other suitable semiconductor material. In some embodiments, the first and second etches are both performed by a sulfur hexafluoride plasma etch, but the second etch uses a larger direct current (DC) bias voltage so the second etch is more vertical. In alternative embodiments, the second etch is performed by a Bosch etch or some other suitable type of etch.

The Bosch etch may, for example, be performed by repeatedly performing a Bosch cycle, which comprises: 1) depositing a passivation film lining the slits 102; 2) etching a bottom of the passivation film to expose the MEMS substrate 106; and 3) etching the MEMS substrate 106 where exposed in the slits 102. The depositing may, for example, be performed by an octafluorocyclobutane (e.g., $C_4F_8$) plasma deposition process or some other suitable deposition process. The etching may, for example, be performed by a plasma etch having a comparatively high and low DC bias voltage respectively during the etching into the passivation film and the etching into the MEMS substrate 106. The plasma etch may, for example, be as described above, whereby the plasma etch may, for example, etch with plasma formed from sulfur hexafluoride (e.g., $SF_6$), chlorine (e.g., $Cl_2$), carbon tetrafluoride (e.g., $CF_4$), fluroform (e.g., $CHF_3$), difluoromethane (e.g., $CH_2F_2$), hydrogen bromide (e.g., HBr), some other suitable type of compound, or any combination of the foregoing. In some embodiments in which the slits 102 are formed by a Bosch etch as described above, the slits 102 may have a scalloped profile. FIG. 3G provides a non-limiting example of such a scalloped profile.

By extending the slits 102 through the frontside semiconductor layer 106f of the MEMS substrate 106 to the insulator layer 106i of the MEMS substrate 106, the second etch forms a movable mass 104. The movable mass 104 may, for example, have a top geometry as in FIG. 5 or 6 or may, for example, have some other suitable top geometry. Note that despite the name, the movable mass 104 has not yet been released and is hence not yet movable.

Figure 18:
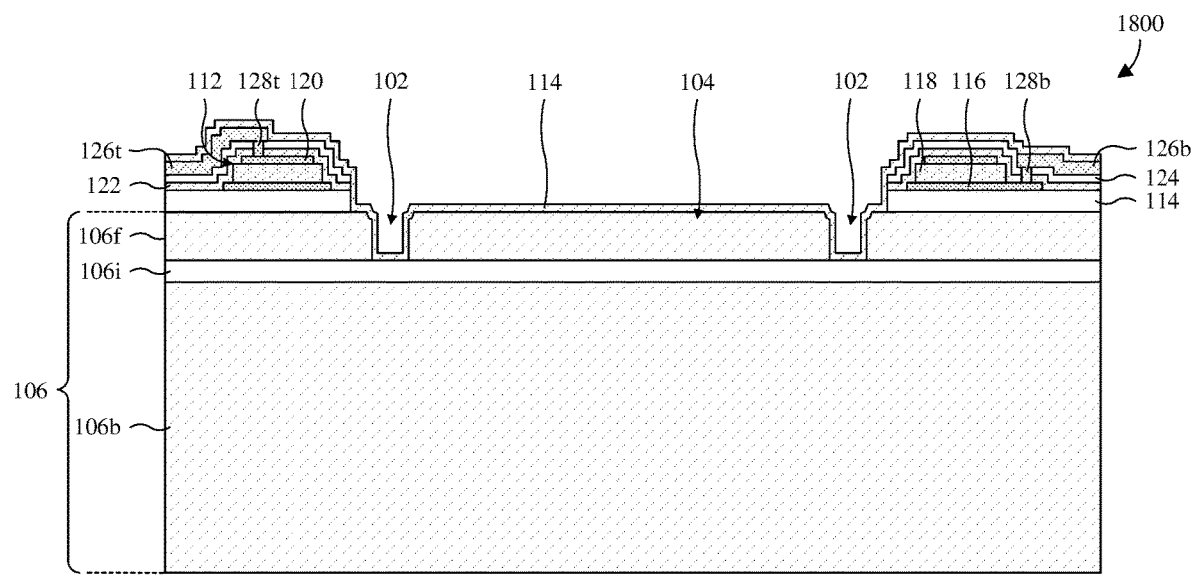

As illustrated by a cross-sectional view 1800 of FIG. 18, the mask 1602 of FIG. 17 is removed. For example, the mask 1602 may be removed by etching and/or some other suitable process. In at least some embodiments in which the mask 1602 is photoresist, the mask 1602 may be removed by plasma ashing or the like.

Also illustrated by the cross-sectional view 1800 of FIG. 18, a passivation layer 110 is deposited covering the MEMS substrate 106 and the actuator structure 112. Further, the passivation layer 110 is deposited lining the slits 102. The passivation layer 110 may, for example, be or comprise silicon nitride and/or some other suitable materials.

Figure 19:
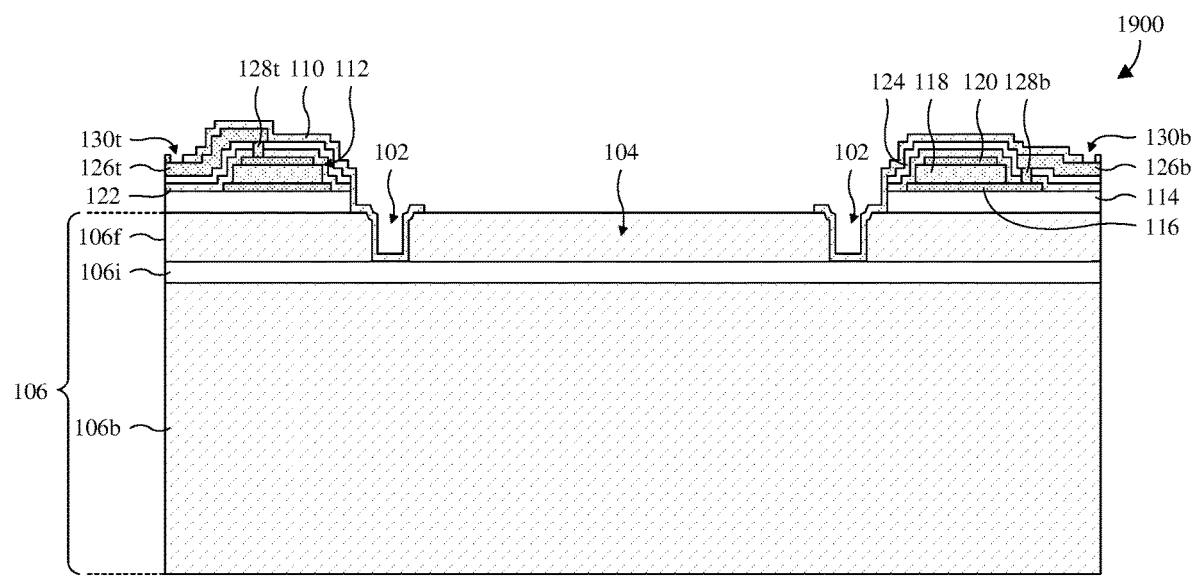

As illustrated by a cross-sectional view 1900 of FIG. 19, the passivation layer 110 is patterned to form a top electrode pad opening 130t and a bottom electrode pad opening 130b respectively exposing the top electrode pad 126t and the bottom electrode pad 126b. Further, the passivation layer 110 is patterned to clear the passivation layer 110 from atop the movable mass 104. The patterning may, for example, be performed by a photolithography/etching process or by some other suitable process.

Figure 20:
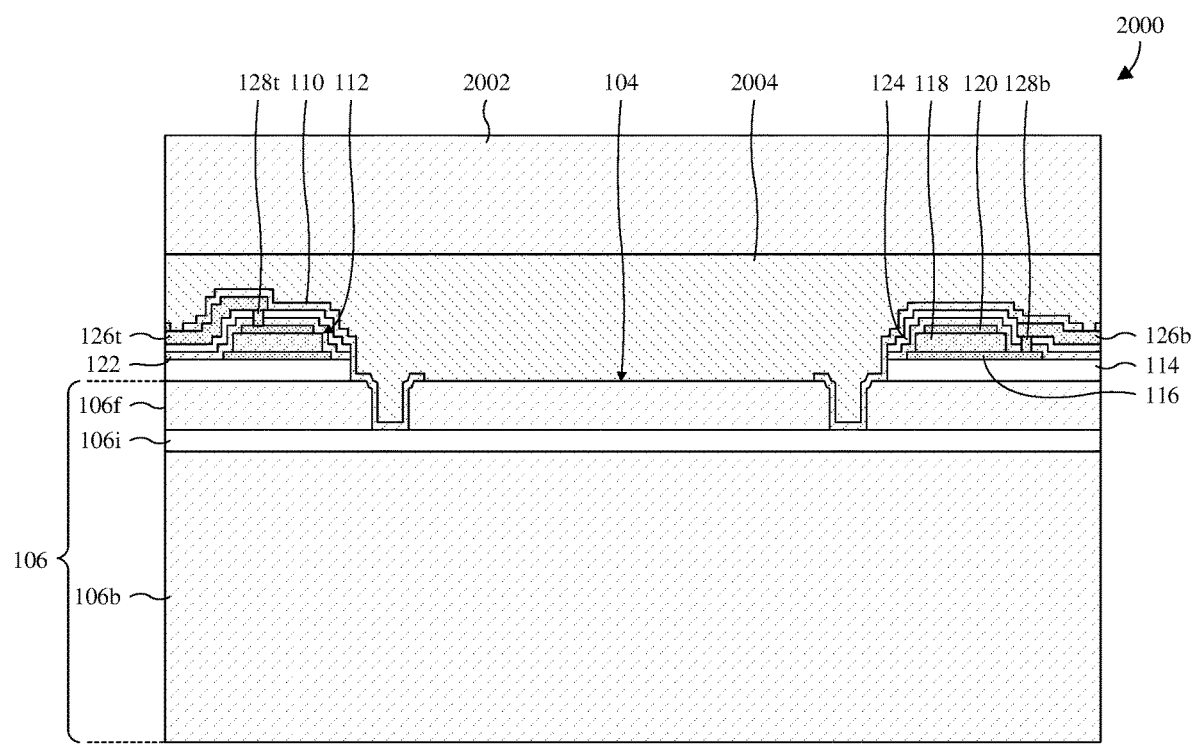

As illustrated by a cross-sectional view 2000 of FIG. 20, a carrier substrate 2002 is bonded to a frontside of the MEMS substrate 106 with an adhesive layer 2004. The adhesive layer 2004 fills the slits 102 and, in at least some embodiments, may additionally or alternatively be regarded as glue or the like.

Figure 21:
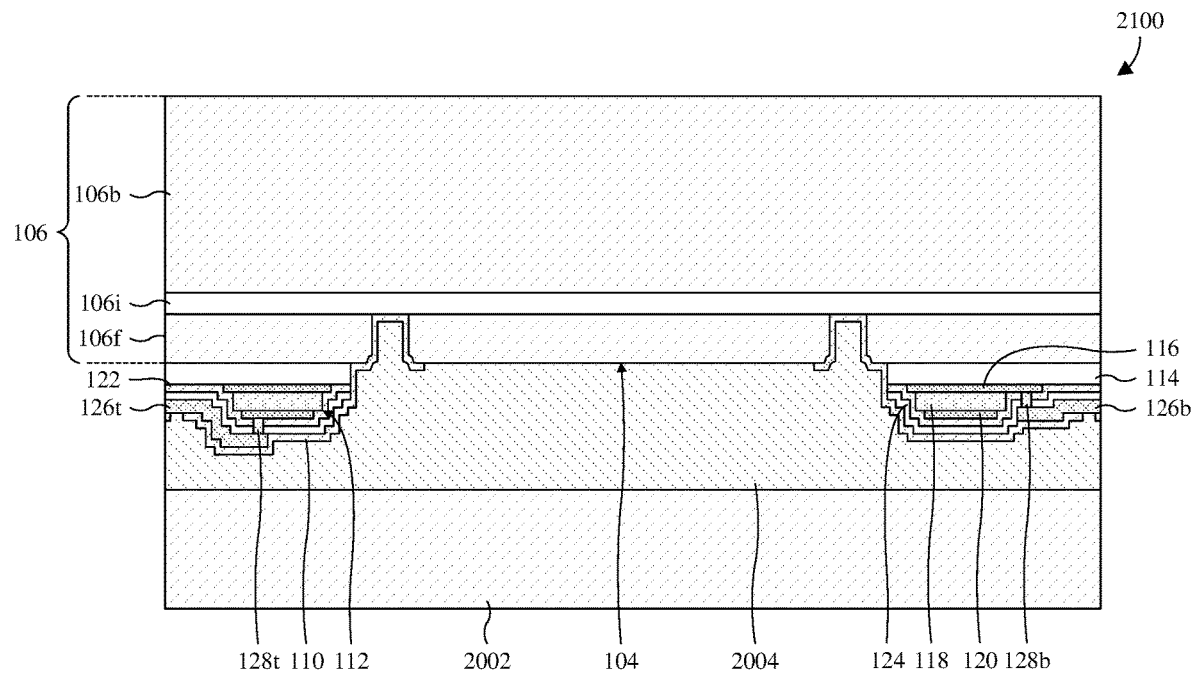

As illustrated by a cross-sectional view 2100 of FIG. 21, the structure of FIG. 20 is vertically flipped. Further, the backside semiconductor layer 106b of the MEMS substrate 106 is thinned, such that the backside semiconductor layer 106b has a reduced thickness compared to in FIG. 20. The thinning may, for example, be performed by a chemical mechanical polishing (CMP) process and/or some other suitable thinning process.

Figure 22:
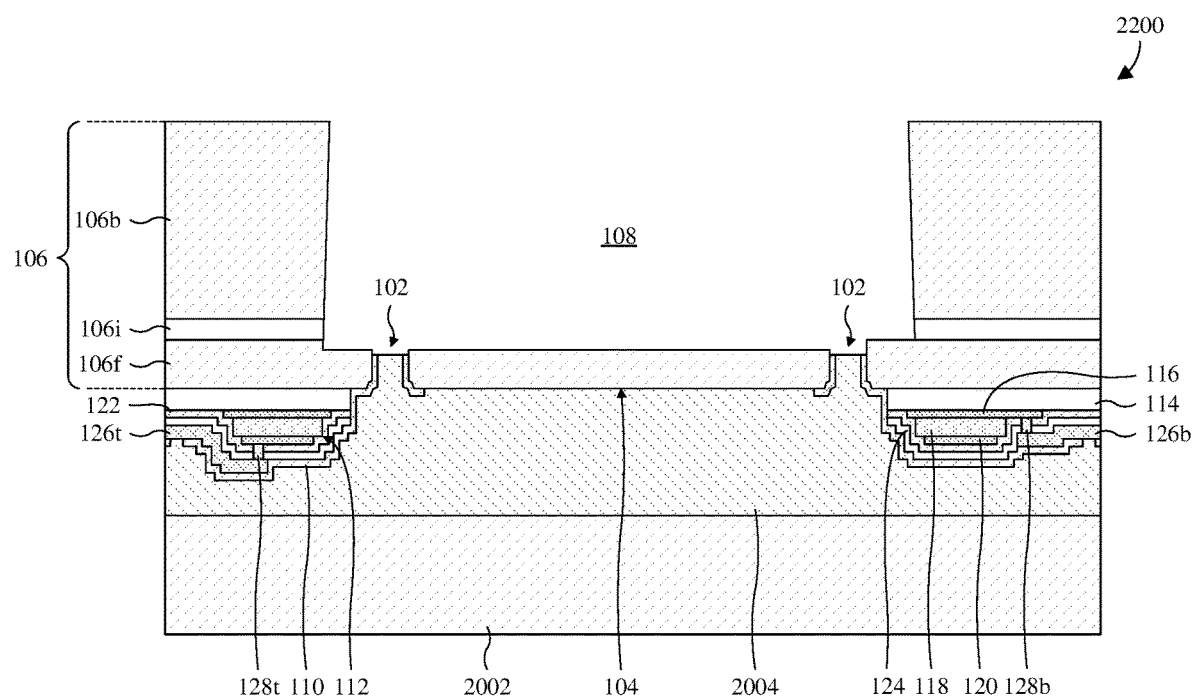

As illustrated by a cross-sectional view 2200 of FIG. 22, the MEMS substrate 106 is patterned to form a cavity 108. The cavity 108 extends through the backside semiconductor layer 106b of the MEMS substrate 106 and the insulator layer 106i of the MEMS substrate 106. Further, the cavity 108 extends into the frontside semiconductor layer 106f. In forming the cavity 108, the patterning exposes the movable mass 104. The patterning may, for example, be performed by a photolithography/etching process or by some other suitable process.

In some embodiments, the patterning further recesses the passivation layer 110 relative to the movable mass 104, thereby partially clearing the slits 102. To the extent the patterning comprises an etch, this partial clearing may result from the etch having a higher etch rate for the passivation layer 110 relative to the movable mass 104.

Figure 23:
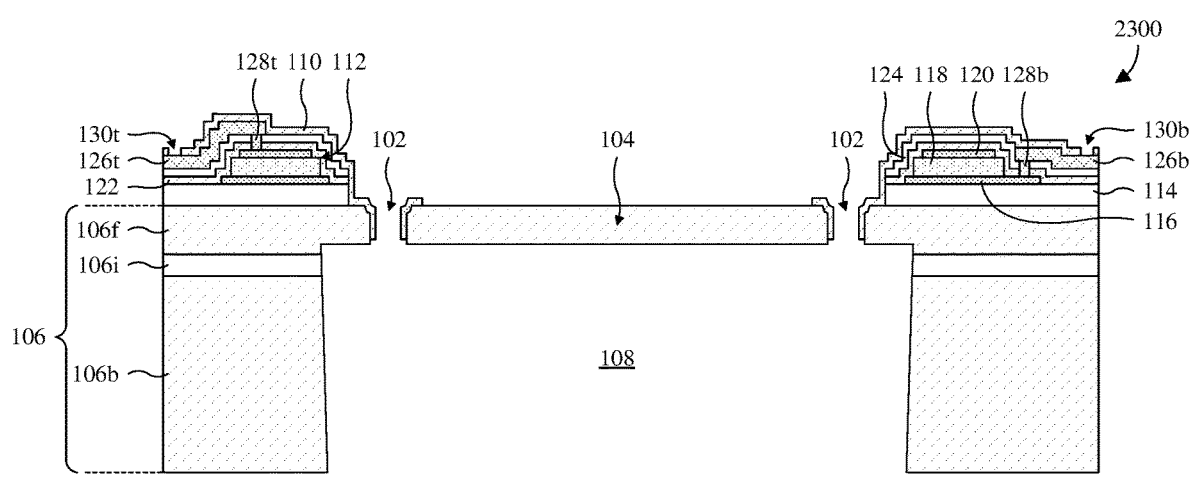

As illustrated by a cross-sectional view 2300 of FIG. 23, the structure of FIG. 22 is flipped vertically. Further, the carrier substrate 2002 is debonded from the frontside of the MEMS substrate 106 and the adhesive layer 2004 is removed from the slits 102. The adhesive layer 2004 may, for example, be removed by peeling or the like. By debonding the carrier substrate 2002 and removing the adhesive layer 2004, the movable mass 104 of the MEMS device is released, whereby the movable mass 104 may move.

Because the first etch described with regard to FIGS. 16A and 16B forms the slits 102 with a top notch slit profile, the slits 102 bulge in width at a top of the movable mass 104. The bulge in width at the top of the movable mass 104 increases the ease with which the adhesive layer 2004 may be removed from the slits 102. Therefore, a process window for removing the adhesive layer 2004 may be enlarged. Further, because of the bulge in width at the top of the movable mass 104, top corners of the MEMS substrate 106 that are in the slits 102 are farther from width-wise centers of the slits 102 than they would otherwise be if the slits 102 had vertical profiles from top to bottom. Therefore, to the extent that the passivation layer 110 deposits on the top corners at a faster rate than elsewhere in the slits 102, the bulge in widths at the top of the movable mass 104 may prevent the passivation layer 110 from bottlenecking and/or pinching off the slit 102a. This may further enlarge the process window for removing the adhesive layer 2004.

Because of the enlarged process window, bulk manufacturing yields for the MEMS device may be increased. Further, the slits 102 may be narrower at a bottom of the movable mass 104 than otherwise possible. In at least some embodiments in which the MEMS device is a speaker, the decreased width of the slits 102 may lower leakage of low frequency sounds through the slits 102. This may, in turn, improve air displacement during use of the speaker and may hence increase audibility of low frequency sounds to the human ear.

While FIGS. 11, 12A, 12B, 13, 14A, 14B, 15, 16A, 16B, and 17-23 are described with reference to a method, it will be appreciated that the structures shown in these figures are not limited to the method but rather may stand alone separate of the method. While FIGS. 11, 12A, 12B, 13, 14A, 14B, 15, 16A, 16B, and 17-23 are described as a series of acts, it will be appreciated that the order of the acts may be altered in other embodiments. While FIGS. 11, 12A, 12B, 13, 14A, 14B, 15, 16A, 16B, and 17-23 illustrate and describe as a specific set of acts, some acts that are illustrated and/or described may be omitted in other embodiments. Further, acts that are not illustrated and/or described may be included in other embodiments.

Figure 24:
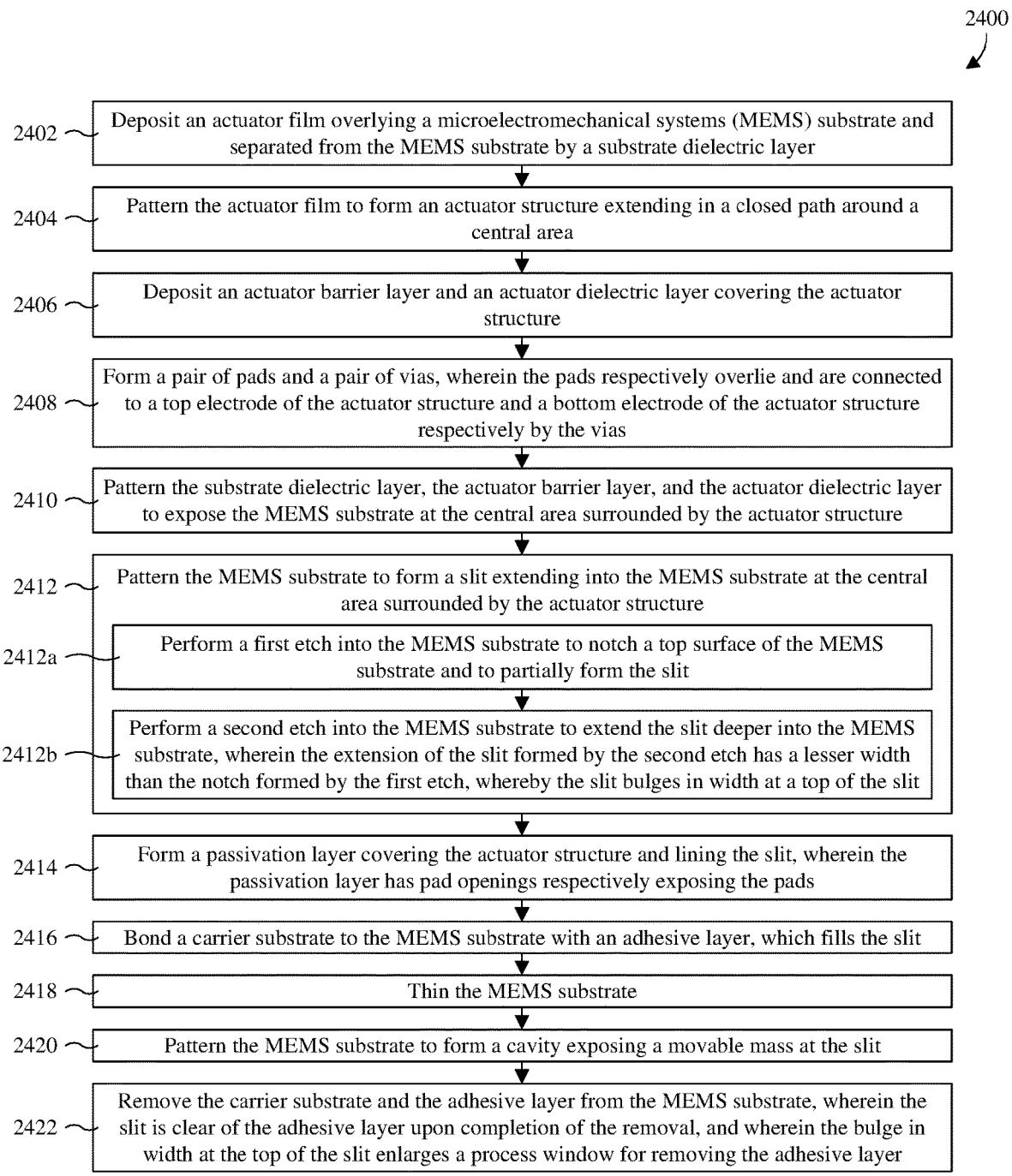
FIG. 24 illustrates a block diagram of some embodiments of the method of FIGS. 11, 12A, 12B, 13, 14A, 14B, 15, 16A, 16B, and 17-23.

With reference to FIG. 24, a block diagram 2400 of some embodiments of the method of FIGS. 11, 12A, 12B, 13, 14A, 14B, 15, 16A, 16B, and 17-23 is provided.

At 2402, an actuator film is deposited overlying a MEMS substrate and separated from the MEMS substrate by a substrate dielectric layer. See, for example, FIG. 11.

At 2404, the actuator film is patterned to form an actuator structure extending in a closed path around a central area. See, for example, FIGS. 12A and 12B.

At 2406, an actuator barrier layer and an actuator dielectric layer are deposited covering the actuator structure. See, for example, FIG. 13.

At 2408, a pair of pads and a pair of vias are formed, wherein the pads respectively overlie and are connected to a top electrode of the actuator structure and a bottom electrode of the actuator structure respectively by the vias. See, for example, FIGS. 14A and 14B.

At 2410, the substrate dielectric layer, the actuator barrier layer, and the actuator dielectric layer are patterned to expose the MEMS substrate at the central area surrounded by the actuator structure. See, for example, FIG. 15.

At 2412, the MEMS substrate is patterned to form a slit extending into the MEMS substrate at the central area surrounded by the actuator structure. At 2412a, a first etch is performed into the MEMS substrate to notch a top surface of the MEMS substrate and to partially form the slit. See, for example, FIGS. 16A and 16B. At 2412b, a second etch is then performed into the MEMS substrate to extend the slit deeper into the MEMS substrate, wherein the extension of the slit formed by the second etch has a lesser width than the notch formed by the first etch, whereby the slit bulges in width at a top of the slit. See, for example, FIG. 17. In some embodiments, the first etch is isotropic and the second etch is anisotropic.

At 2414, a passivation layer is formed covering the actuator structure and lining the slit, wherein the passivation layer has pad openings respectively exposing the pads. See, for example, FIGS. 18 and 19.

At 2416, a carrier substrate is bonded to the MEMS substrate with an adhesive layer, which fills the slit. See, for example, FIG. 20.

At 2418, the MEMS substrate is thinned. See, for example, FIG. 21.

At 2420, the MEMS substrate is patterned to form a cavity exposing a movable mass at the slit. See, for example, FIG. 22.

At 2422, the carrier substrate and the adhesive layer are removed from the MEMS substrate, wherein the slit is clear of the adhesive layer upon completion of the removal, and wherein the bulge in width at the top of the slit enlarges a process window for removing the adhesive layer. See, for example, FIG. 23.

While the block diagram 2400 of FIG. 24 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 25-31, a series of cross-sectional views of some embodiments of a method for forming a MEMS package is provided in which a slit at a movable mass of a MEMS device has a top notch slit profile. The method may, for example, be employed to form the MEMS package of FIG. 9 or some other suitable MEMS package. Further, the MEMS device of the method may, for example, be an actuator or some other suitable MEMS device.

Figure 25:
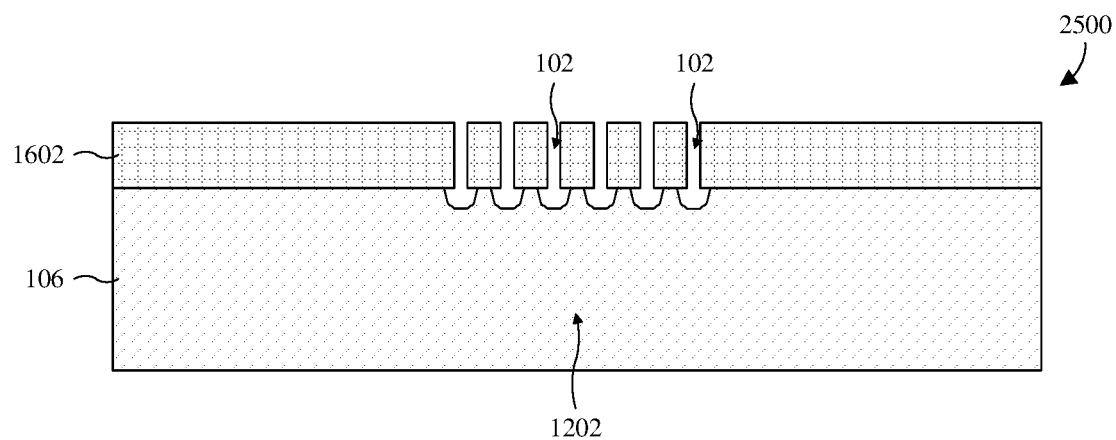
FIGS. 25-31 illustrate a series of cross-sectional views of some alternative embodiments of a method for forming a MEMS device in which a slit at a movable mass of the MEMS device has a top notch slit profile.

As illustrated by a cross-sectional view 2500 of FIG. 25, a mask 1602 is formed overlying a MEMS substrate 106. The MEMS substrate 106 may, for example, be a bulk substrate of silicon or some other suitable type of semiconductor material, a SOI substrate, or some other suitable type of semiconductor substrate.

Also illustrated by the cross-sectional view 2500 of FIG. 25, a first etch is performed into the MEMS substrate 106 with the mask 1602 in place. The first etch notches a top surface of the MEMS substrate 106 to partially form a plurality of slits 102 at a central area 1202 of the MEMS substrate 106. The partially formed slits 102 each individually have an isotropic top notch profile and undercut the mask 1602. In alternative embodiments, the slits 102 each individually have some other suitable profile. The mask 1602 may, for example, be as described with regard to FIGS. 16A and 16B and/or may, for example, be formed as described with regard to FIGS. 16A and 16B. Further, the first etch may, for example, be performed as described with regard to FIGS. 16A and 16B. For example, the first etch may be performed by an isotropic process and/or by a sulfur hexafluoride (e.g., $SF_6$) plasma etch.

Figure 26:
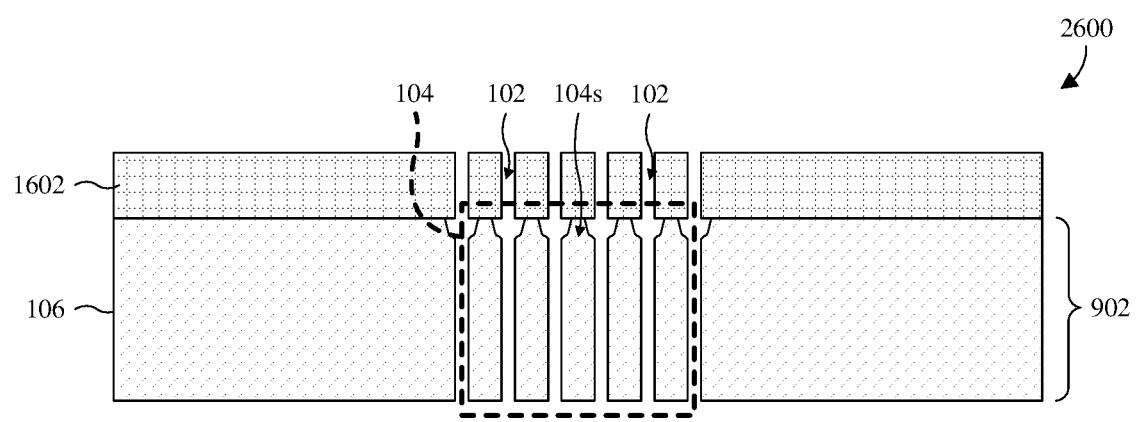

As illustrated by a cross-sectional view 2600 of FIG. 26, a second etch is performed into the MEMS substrate 106 with the mask 1602 of FIG. 25 in place to extend the slits 102 through the MEMS substrate 106. In contrast with the first etch, the portions of the slits 102 formed by the second etch have a lesser width than the portions of the slits 102 formed by the first etch, whereby the slits 102 bulge in width at a top of the MEMS substrate 106. In at least some embodiments, this results from the first etch being isotropic and the second etch being anisotropic. The first etch may, for example, be performed as described with regard to FIG. 17. For example, the second etch may be performed by an anisotropic process and/or by a Bosch etch.

By extending the slits 102 through the MEMS substrate 106, the second etch forms the movable mass 104 of the MEMS device 902 being formed. The movable mass 104 includes a plurality of segments 104s separated from each other by the slits 102. In some embodiments, the segments 104s of the movable mass 104 each individually have a finger-shaped top geometry. In other embodiments, the segments 104s of the movable mass 104 each individually have some other suitable top geometry.

Figure 27:
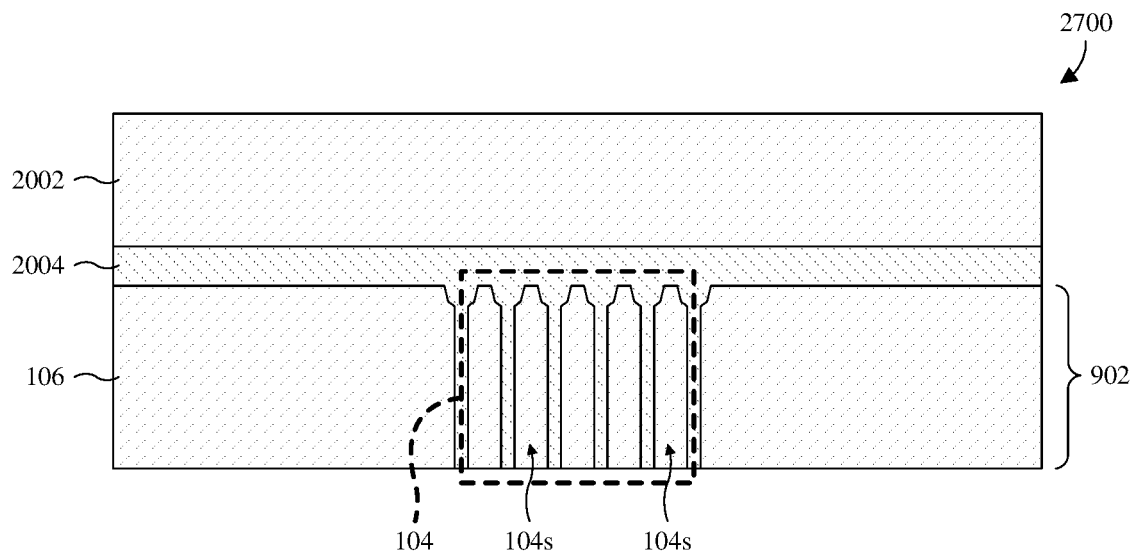

As illustrated by a cross-sectional view 2700 of FIG. 27, a carrier substrate 2002 is bonded to an upper side of the MEMS substrate 106 with an adhesive layer 2004. The adhesive layer 2004 fills the slits 102 and, in at least some embodiments, may additionally or alternatively be regarded as glue or the like.

Figure 28:
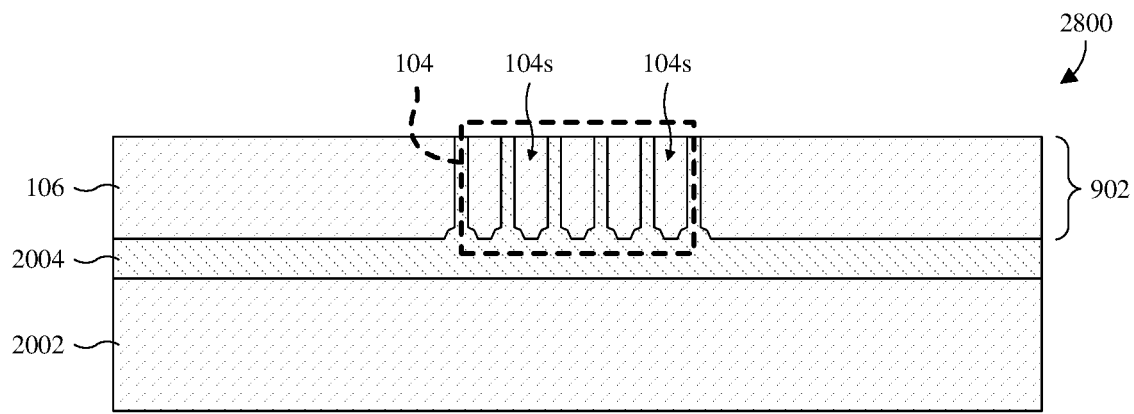

As illustrated by a cross-sectional view 2800 of FIG. 28, the structure of FIG. 27 is vertically flipped. Further, the MEMS substrate 106 is thinned, such that the MEMS substrate 106 has a reduced thickness compared to in FIG. 27. The thinning may, for example, be performed by a CMP process and/or some other suitable thinning process.

Figure 29:
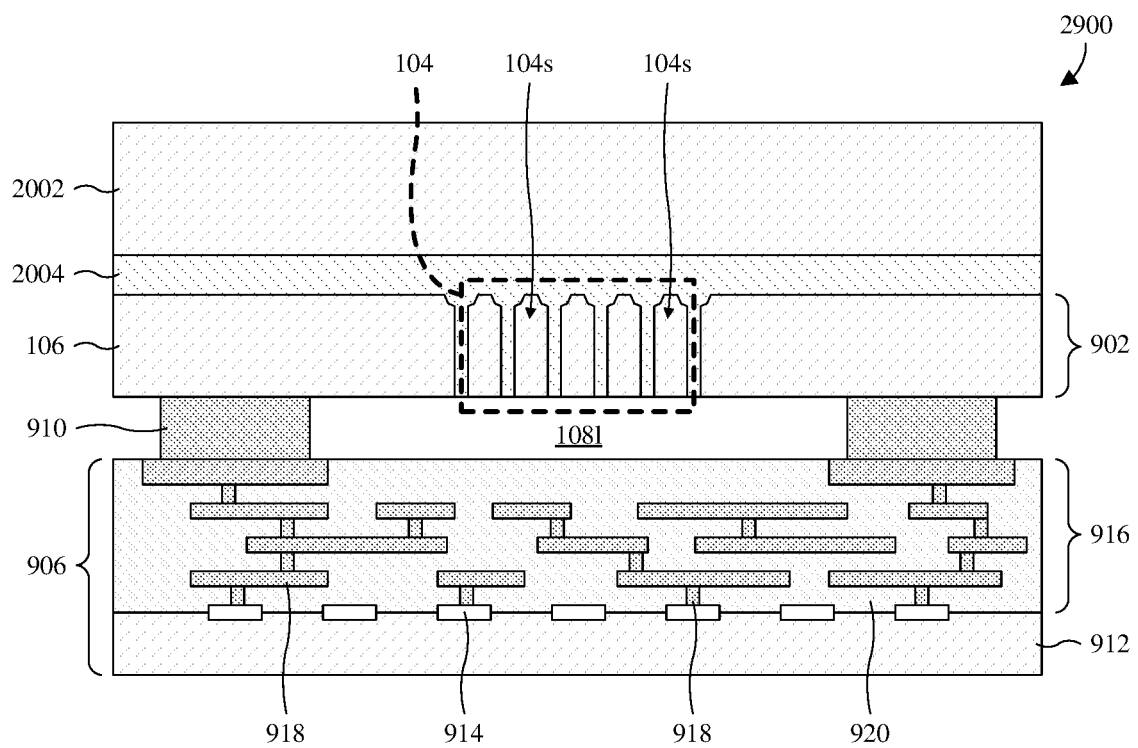

As illustrated by a cross-sectional view 2900 of FIG. 29, and an IC chip 906 is formed. The IC chip 906 comprises a semiconductor substrate 912, a plurality of semiconductor devices 914, and an interconnect structure 916. The semiconductor devices 914 overlie and are at least partially formed in the semiconductor substrate 912. The interconnect structure 916 overlies and is electrically coupled to the semiconductor devices 914. Further, the interconnect structure 916 comprises a plurality of conductive features 918 stacked in an interconnect dielectric layer 920 to form a plurality of conductive paths interconnecting the semiconductor devices 914 and/or extending from the semiconductor devices 914.

Also illustrated by the cross-sectional view 2900 of FIG. 29, the structure of FIG. 28 is vertically flipped and is bonded and electrically coupled to the IC chip 906 through contacts 910. The contacts 910 space the MEMS device 902 from the IC chip 906, thereby forming a lower cavity 108l between the MEMS device 902 and the IC chip 906.

Figure 30:
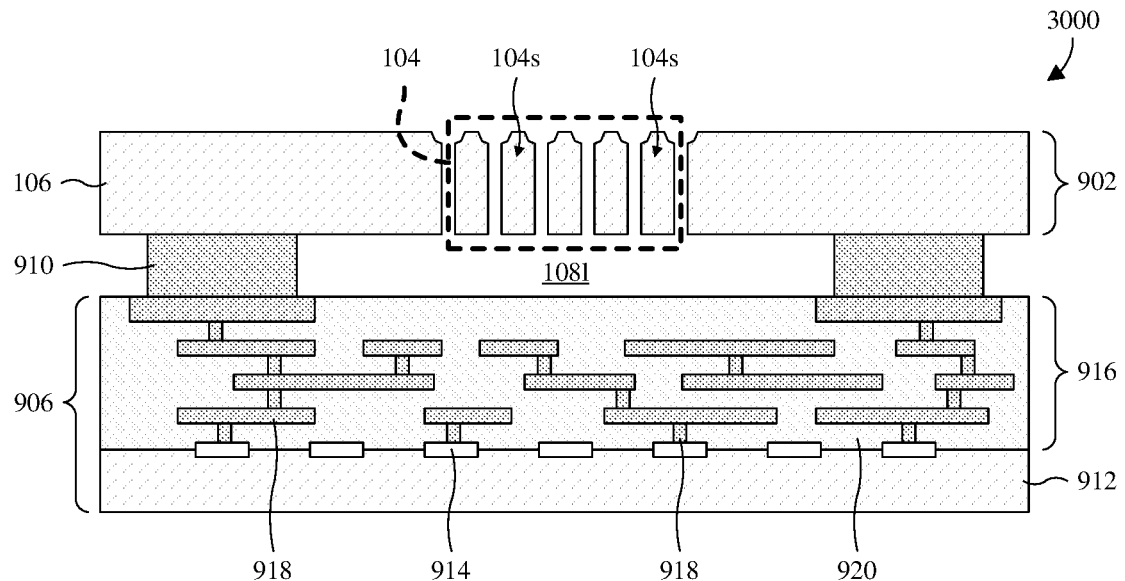

As illustrated by a cross-sectional view 3000 of FIG. 30, the carrier substrate 2002 is debonded from the MEMS substrate 106 and the adhesive layer 2004 is removed from the slits 102. The adhesive layer 2004 may, for example, be removed by peeling or the like. By debonding the carrier substrate 2002 and removing the adhesive layer 2004, the movable mass 104 of the MEMS device is released, whereby the movable mass 104 may move.

Because the first etch described with regard to FIG. 25 forms the slits 102 with top notch slit profiles, the slits 102 bulge in width at a top of the movable mass 104. The bulge in width at the top of the movable mass 104 increases the ease with which the adhesive layer 2004 may be removed from the slits 102. Therefore, a process window for removing the adhesive layer 2004 may be enlarged and hence bulk manufacturing yields for the MEMS device may be increased. Additionally, because of the increased widths of the slits 102, the MEMS device 902 is more resilient during operation. The increased widths reduce the likelihood of damage to the movable mass 104 upon collision between the segments 104s of the movable mass 104. Further, the increased widths reduce top surface are of the movable mass 104, which reduces the likelihood of stiction between a capping substrate hereafter formed and the movable mass 104.

Figure 31:
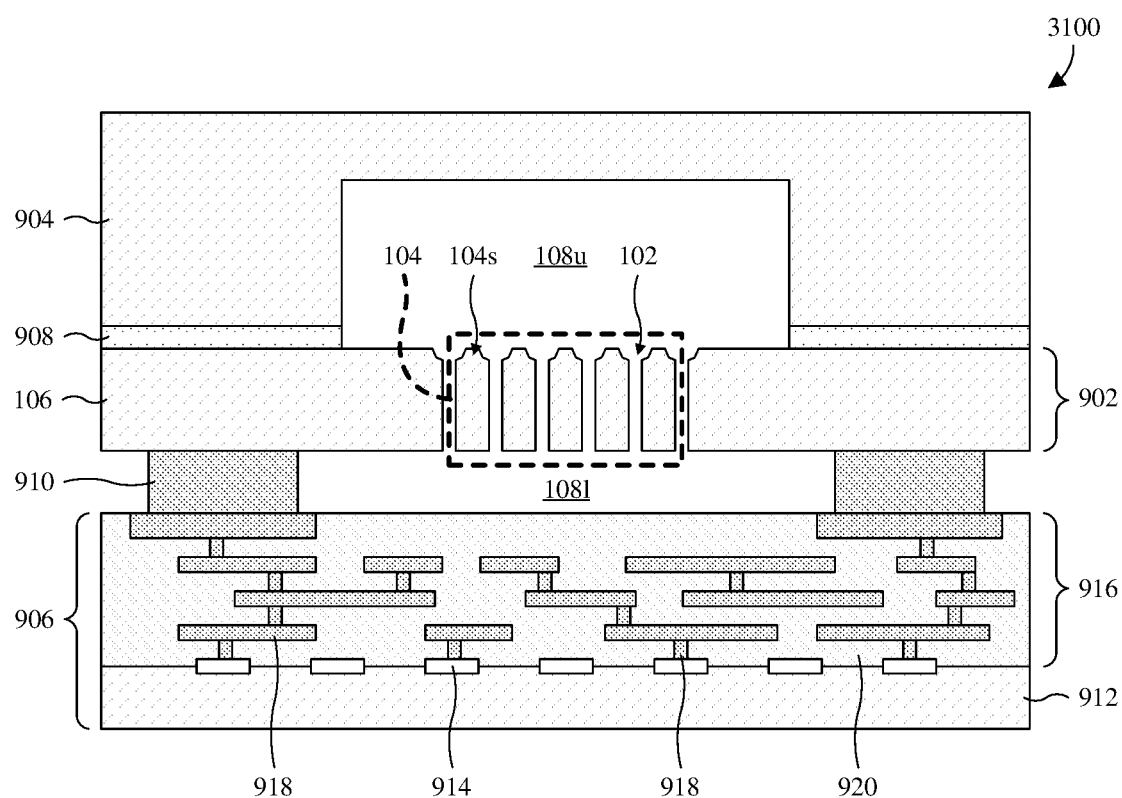

As illustrated by a cross-sectional view 3100 of FIG. 31, a cap substrate 904 having a bottom recess is arranged over and bonded to the MEMS substrate 106 through an adhesive layer 908, thereby by forming an upper cavity 108u overlying the movable mass 104. The bulge in widths at tops of the slits 102 reduces top surface area of the movable mass 104, thereby reducing the likelihood of stiction between the movable mass 104 and the cap substrate 904.

While FIGS. 25-31 are described with reference to a method, it will be appreciated that the structures shown in these figures are not limited to the method but rather may stand alone separate of the method. While FIGS. 25-31 are described as a series of acts, it will be appreciated that the order of the acts may be altered in other embodiments. While FIGS. 25-31 illustrate and describe as a specific set of acts, some acts that are illustrated and/or described may be omitted in other embodiments. Further, acts that are not illustrated and/or described may be included in other embodiments.

Figure 32:
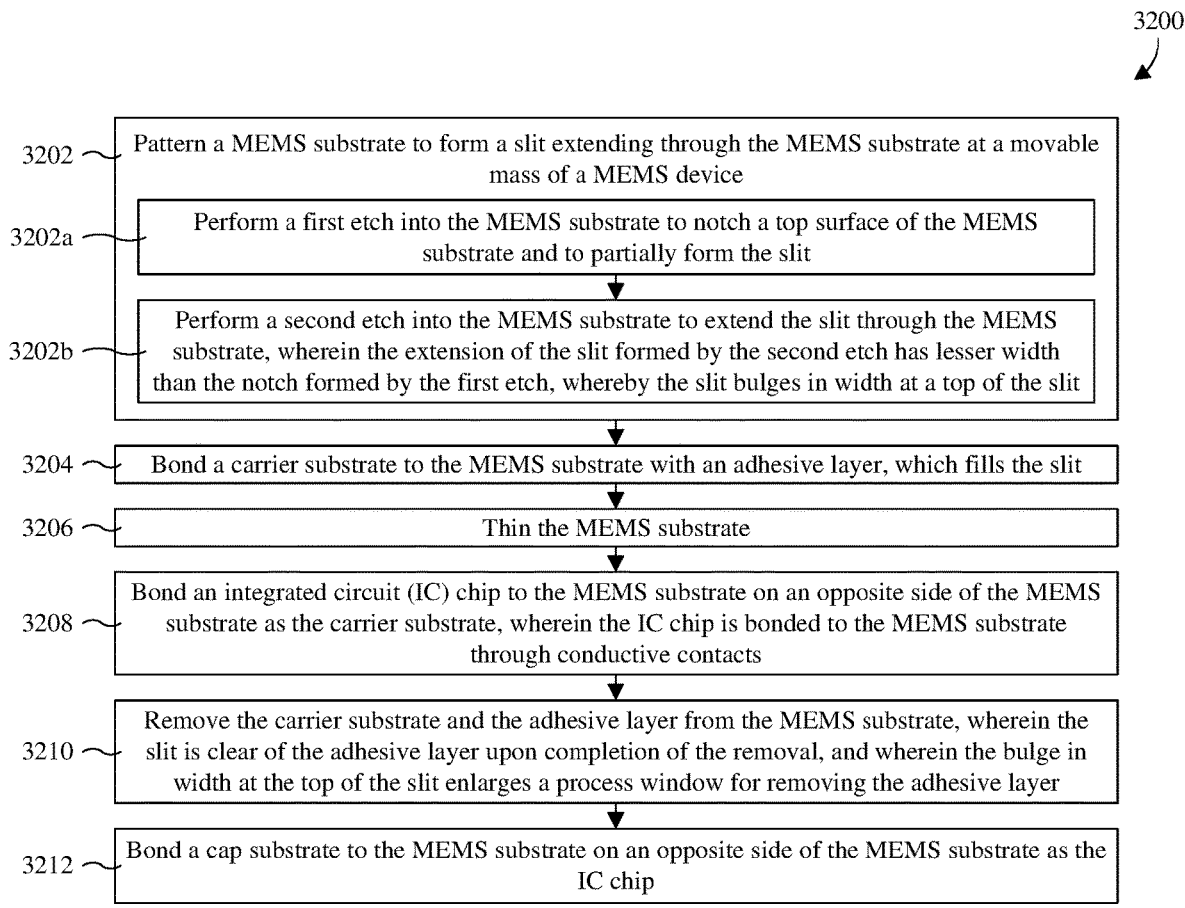
FIG. 32 illustrates a block diagram of some embodiments of the method of FIGS. 25-31.

With reference to FIG. 32, a block diagram 3200 of some embodiments of the method of FIGS. 25-31 is provided.

At 3202, a MEMS substrate is patterned to form a slit extending through the MEMS substrate at a movable mass of a MEMS device. More specifically, at 3202*a*, a first etch is performed into the MEMS substrate to notch a top surface of the MEMS substrate and to partially form the slit. See, for example, FIG. 25. Further, at 3202*b*, a second etch is performed into the MEMS substrate to extend the slit through the MEMS substrate, wherein the extension of the slit formed by the second etch has lesser width than the notch formed by the first etch, whereby the slit bulges in width at a top of the slit. See, for example, FIG. 26.

At 3204, a carrier substrate is bonded to the MEMS substrate with an adhesive layer, which fills the slit. See, for example, FIG. 27.

At 3204, the MEMS substrate is thinned. See, for example, FIG. 28.

At 3206, an IC chip is bonded to the MEMS substrate on an opposite side of the MEMS substrate as the carrier substrate, wherein the IC chip is bonded to the MEMS substrate through conductive contacts. See, for example, FIG. 29.

At 3208, the carrier substrate and the adhesive layer are removed from the MEMS substrate, wherein the slit is clear of the adhesive layer upon completion of the removal, and wherein the bulge in width at the top of the slit enlarges a process window for removing the adhesive layer. See, for example, FIG. 30.

At 3210, a cap substrate is bonded to the MEMS substrate on an opposite side of the MEMS substrate as the IC chip. See, for example, FIG. 31.

While the block diagram 3200 of FIG. 32 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides a structure including: a substrate; and a MEMS device on the substrate, wherein the MEMS device includes a mechanical mass formed in the substrate; wherein the substrate has a slit at the mechanical mass, wherein the slit extends through the substrate, from a top surface of the mechanical mass to a bottom surface of the mechanical mass, wherein the substrate has a first sidewall and a second sidewall in the slit and arranged edge to edge, wherein the first sidewall is substantially vertical from the bottom surface of the mechanical mass to an edge of the second sidewall, and wherein the second sidewall arcs outward from the edge of the second sidewall to the top surface of the mechanical mass. In some embodiments, the edge is closer to the top surface of the mechanical mass than the bottom surface of the mechanical mass. In some embodiments, the substrate has a second slit extending through the substrate, from the top surface of the mechanical mass to the bottom surface of the mechanical mass, wherein a portion of the substrate is between and exposed in the slit and the second slit, and wherein the portion of the substrate has an upward protrusion at a top corner portion of the substrate. In some embodiments, the slit has a symmetrical profile about a vertical axis at a width-wise center of the slit. In some embodiments, the MEMS device includes a piezoelectric structure extending in a closed path around the mechanical mass and configured to vibrate the mechanical mass. In some embodiments, the slit is elongated laterally from a corner of the mechanical mass towards a center of the mechanical mass. In some embodiments, the structure further includes: a cap substrate overlying the substrate; a semiconductor substrate underlying the substrate; and an interconnect structure between the semiconductor substrate and the substrate; wherein the mechanical mass is configured to move in a cavity between the cap substrate and the interconnect structure.

In some embodiments, the present disclosure provides another structure including: a substrate; and a MEMS device on the substrate, wherein the MEMS device includes a mechanical mass formed in the substrate; wherein the substrate has a slit at the mechanical mass, wherein the slit is disposed through the substrate, from a top surface of the mechanical mass to a bottom surface of the mechanical mass, wherein a width of the slit is substantially uniform from the bottom surface of the mechanical mass to an elevation offset from and between the top and bottom surfaces of the mechanical mass, and wherein the width of the slit bulges from the elevation to the top surface of the mechanical mass. In some embodiments, the width of the slit increases from the bottom surface of the mechanical mass to the elevation at a first rate, wherein the width of the slit increases from the elevation to the top surface of the mechanical mass at a second rate greater than the first rate. In some embodiments, a top corner portion of the substrate in the slit is indented. In some embodiments, the slit extends laterally from individual corners of the mechanical mass to a center of the mechanical mass to form a cross shape. In some embodiments, the MEMS device includes a bottom electrode, a piezoelectric structure overlying the bottom electrode, and a top electrode overlying the piezoelectric structure, wherein the bottom and top electrodes and the piezoelectric structure extend in individual closed paths around the mechanical mass along a periphery of the mechanical mass. In some embodiments, the structure further includes a passivation layer covering the MEMS device and lining the slit, wherein a bottom surface of the passivation layer is in the slit and is elevated relative to a bottom surface of the mechanical mass.

In some embodiments, the present disclosure provides a method including: performing a first etch into a first side of a substrate to form a notch extending into the substrate to a first depth; performing a second etch into the first side of the substrate to from a trench extending into the substrate to a second depth greater than the first depth, wherein the trench overlaps with the notch and has a lesser width than the notch; bonding a carrier substrate to the first side of the substrate with an adhesive filling the notch and the trench and covering the first side of the substrate; thinning the substrate from a second side of the substrate, opposite the first side; and removing the carrier substrate and the adhesive after the thinning. In some embodiments, the first etch is performed by an isotropic etch, wherein the second etch is performed by an anisotropic etch. In some embodiments, the method further includes forming a mask overlying the substrate on the first side of the substrate, wherein the first and second etches are performed with the mask in place to form the notch and the trench underlying an opening in the mask. In some embodiments, the substrate includes a first semiconductor layer, an insulator layer overlying the first semiconductor layer, a second semiconductor layer overlying the insulator layer, wherein the first and second etches are performed into the second semiconductor layer, wherein the first etch stop before reaching the insulator layer, and wherein the second etch stops at the insulator layer. In some embodiments, the method further includes: depositing a piezoelectric layer over the substrate, on the first side of the substrate; and patterning the piezoelectric layer to form a piezoelectric structure having a ring-shaped layout, wherein the notch and the trench are formed at a central area surrounded by the piezoelectric structure. In some embodiments, the method further includes performing a third etch into the substrate from the second side of the substrate to form a cavity exposing the trench between the thinning and the removing. In some embodiments, the method further includes: forming an interconnect structure overlying a semiconductor substrate; bonding the second side of the substrate to the interconnect structure, such that the second side of the substrate is between the interconnect structure and the first side of the substrate, wherein the bonding is performed between the thinning and the removing; and bonding a cap substrate to the first side of the substrate after the removing; wherein the first and second etches form a mechanical mass configured to move in a cavity between the interconnect structure and the cap substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
performing a first etch into a first side of a substrate to form a notch extending into the substrate to a first depth;
performing a second etch into the first side of the substrate to form a trench extending into the substrate to a second depth greater than the first depth, wherein the trench overlaps with the notch and has a lesser width than the notch;
bonding a carrier substrate to the first side of the substrate with an adhesive filling the notch and the trench and covering the first side of the substrate;
thinning the substrate from a second side of the substrate, opposite the first side; and
removing the carrier substrate and the adhesive after the thinning;
wherein the first and second etches are performed with a mask in place to form the notch and the trench underlying an opening in the mask.

2. The method according to claim 1, wherein the first etch is performed by an isotropic etch, and wherein the second etch is performed by an anisotropic etch.

3. The method according to claim 1, wherein the substrate comprises a first semiconductor layer, an insulator layer overlying the first semiconductor layer, and a second semiconductor layer overlying the insulator layer, wherein the first and second etches are performed into the second semiconductor layer, wherein the first etch stops before reaching the insulator layer, and wherein the second etch stops at the insulator layer.

4. The method according to claim 1, further comprising:
depositing a piezoelectric layer over the substrate, on the first side of the substrate; and
patterning the piezoelectric layer to form a piezoelectric structure having a ring-shaped layout, wherein the notch and the trench are formed at a central area surrounded by the piezoelectric structure.

5. The method according to claim 4, further comprising:
performing a third etch into the substrate from the second side of the substrate to form a cavity exposing the trench between the thinning and the removing.

6. The method according to claim 1, further comprising:
forming an interconnect structure overlying a semiconductor substrate;
bonding the second side of the substrate to the interconnect structure, such that the second side of the substrate is between the interconnect structure and the first side of the substrate, wherein the bonding is performed between the thinning and the removing; and
bonding a cap substrate to the first side of the substrate after the removing;
wherein the first and second etches form a mechanical mass configured to move in a cavity between the interconnect structure and the cap substrate.

7. A method comprising:
forming a piezoelectric actuator on a first side of a substrate and extending in a closed path around a central area of the substrate;
performing a first etch into the central area of the substrate from the first side of the substrate and with a mask in place to form a slit, wherein the first etch is isotropic and laterally undercuts the mask at the slit;
performing a second etch into the central area of the substrate from the first side of the substrate to extend a depth of the slit, wherein the second etch is anisotropic and is performed with the mask in place; and
performing a third etch into the central area of the substrate from a second side of the substrate, opposite the first side of the substrate, to form a cavity exposing the slit.

8. The method according to claim 7, wherein the substrate comprises a first semiconductor layer, an insulator layer overlying the first semiconductor layer, and a second semiconductor layer overlying the insulator layer, wherein the first etch forms the slit in the second semiconductor layer and spaced from the insulator layer, wherein the second etch extends the slit to the insulator layer, and wherein the third etch forms the cavity extending through the first semiconductor layer and the insulator layer.

9. The method according to claim 7, wherein the substrate has a first sidewall and a second sidewall in the slit and arranged edge to edge at an interface, wherein the first sidewall is substantially vertical, and wherein the second sidewall arcs outward from the interface to a top surface of the substrate, which is on the first side of the substrate.

10. The method according to claim 7, wherein the slit has a line-shaped top layout laterally elongated from a corner of the central area of the substrate towards a center of the central area of the substrate.

11. The method according to claim 7, further comprising:
bonding a carrier substrate to the first side of the substrate;
thinning the substrate from the second side of the substrate, wherein the cavity is formed after the thinning; and
removing the carrier substrate after forming the cavity.

12. The method according to claim 11, wherein the slit partially forms a movable mass at the central area of the substrate, and wherein the forming of the cavity and the removing of the carrier substrate release the movable mass.

13. The method according to claim 7, further comprising:
depositing a passivation layer overlying the piezoelectric actuator and lining the slit, wherein the passivation layer has a horizontally extending portion at a bottom of the slit, and wherein the third etch removes the horizontally extending portion of the passivation layer.

14. A method comprising:
performing a first etch into a first side of a substrate, through an opening in a mask, to form a notch, which is spaced from a second side of the substrate, opposite the first side of the substrate, and has a greater width than the opening;
performing a second etch into the first side of the substrate through the opening in the mask to form a trench, which extends from the notch to the second side of the substrate and is confined to directly under the opening;
bonding a carrier substrate to the first side of the substrate with an adhesive filling the notch and the trench;
bonding an integrated circuit (IC) chip to the second side of the substrate;
removing the carrier substrate and the adhesive after the bonding of the IC chip to the second side of the substrate; and
bonding a cap substrate to the first side of the substrate after the removing, wherein the cap substrate has a cavity overlying the notch and the trench.

15. The method according to claim 14, wherein the trench is substantially uniform in width from the notch to the second side of the substrate, and wherein the notch increases in width away from the trench.

16. The method according to claim 15, wherein the trench has a same width as the opening.

17. The method according to claim 14, wherein the notch and the trench partially demarcate a movable mass in the substrate, and wherein removing of the adhesive releases the movable mass to allow movement of the movable mass.

18. The method according to claim 14, further comprising:
performing a planarization into the adhesive and the second side of the substrate to thin the substrate before the bonding of the IC chip.

19. The method according to claim 14, wherein the first etch forms a plurality of notches, including the notch, in the first side of the substrate, wherein the second etch forms a plurality of trenches, including the trench, extending respectively from the plurality of notches to the second side of the substrate, and wherein the plurality of notches and the plurality of trenches demarcate a movable mass of a microelectromechanical systems (MEMS) device.

20. The method according to claim 1, wherein the notch has a greater width than the opening in the mask.

* * * * *